(12) United States Patent
Su

(10) Patent No.: US 12,170,205 B2
(45) Date of Patent: Dec. 17, 2024

(54) METHODS FOR FABRICATING SEMICONDUCTOR STRUCTURES

(71) Applicant: TAIWAN SEMICONDUCTOR MANUFACTURING COMPANY, LTD., Hsinchu (TW)

(72) Inventor: Yi-Nien Su, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 588 days.

(21) Appl. No.: 17/400,371

(22) Filed: Aug. 12, 2021

(65) Prior Publication Data

US 2023/0045826 A1 Feb. 16, 2023

(51) Int. Cl.
*H01L 21/311* (2006.01)
*H01L 21/033* (2006.01)
*H01L 21/768* (2006.01)

(52) U.S. Cl.
CPC .... *H01L 21/31144* (2013.01); *H01L 21/0332* (2013.01); *H01L 21/0334* (2013.01); *H01L 21/0337* (2013.01); *H01L 21/76897* (2013.01)

(58) Field of Classification Search
CPC ........... H01L 21/31144; H01L 21/0332; H01L 21/0337; H01L 21/0334
See application file for complete search history.

(56) References Cited

U.S. PATENT DOCUMENTS

| | | | |
|---|---|---|---|
| 9,117,766 B2 * | 8/2015 | Sant | H10B 99/00 |
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2002/0177322 A1 * | 11/2002 | Li | H01L 21/31116 |
| | | | 257/E21.252 |
| 2004/0021196 A1 * | 2/2004 | Brennan | H01L 21/76897 |
| | | | 257/E21.507 |
| 2015/0064912 A1 | 3/2015 | Jang et al. | |
| 2019/0148159 A1 * | 5/2019 | Huang | H01L 21/31116 |
| | | | 438/689 |
| 2019/0237333 A1 * | 8/2019 | Su | H01L 21/0332 |
| 2019/0318960 A1 * | 10/2019 | Briggs | H01L 21/76831 |
| 2020/0006082 A1 * | 1/2020 | Su | H01L 21/02178 |

FOREIGN PATENT DOCUMENTS

| | | |
|---|---|---|
| TW | 201830576 A | 8/2018 |
| TW | 201923858 A | 6/2019 |
| TW | 202002076 A | 1/2020 |
| TW | 202029304 A | 8/2020 |

* cited by examiner

*Primary Examiner* — Ratisha Mehta
*Assistant Examiner* — Brad A Knudson
(74) *Attorney, Agent, or Firm* — NZ CARR LAW OFFICE

(57) ABSTRACT

Embodiments of the present disclosure relates to method of forming trench and via features using dielectric and metal mask layers. Particularly, embodiments of present disclosure provide a hard mask stack including a first dielectric mask layer, and second dielectric mask layer and a metal mask layer, wherein the first dielectric mask layer and second dielectric mask layer have a high etch selectivity.

20 Claims, 20 Drawing Sheets

METHODS FOR FABRICATING SEMICONDUCTOR STRUCTURES

BACKGROUND

The semiconductor industry has experienced continuous rapid growth due to constant improvements in the integration density of various electronic components. For the most part, this improvement in integration density has come from repeated reductions in minimum feature size, allowing more components to be integrated into a given chip area.

During fabrication of integrated circuits, patterns are first formed in photoresist layers by lithography processes, and then transferred to hard mask layers by one or more etching processes, and then formed in a target layer under the hard mask layers. However, with the increasing down scaling of integrated circuits, features transferred to hard mask layers may breakdown in subsequent etching processes resulting in defects or low-quality features in the target layer.

Therefore, there is a need for improved hard mask layers and methods for patterning associated thereof.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
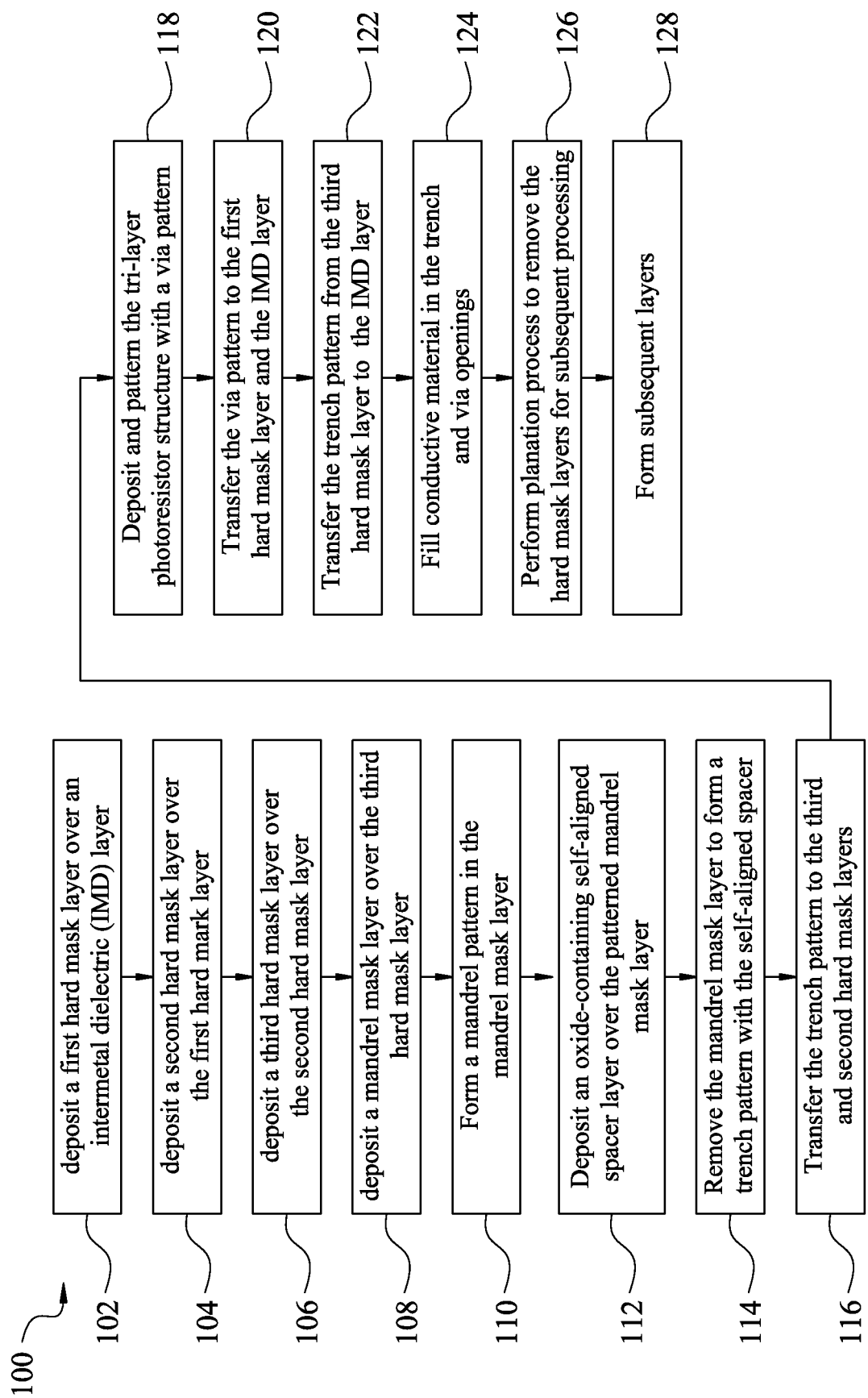
FIG. 1 is a flow chart of a method for manufacturing of a semiconductor device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 64 degrees or at other orientations) and the spatially relative descriptors used herein may likewise be interpreted accordingly.

Embodiments of the present disclosure relates to method of forming trench and via features using dielectric and metal mask layers. Particularly, embodiments of present disclosure provide a hard mask stack including two dielectric mask layers, and a metal-containing mask layer between the two dielectric mask layers, wherein the two dielectric mask layers are selected from different materials having a high etch selectivity relative to each other.

FIG. 1 is a flow chart of a method 100 for manufacturing of a semiconductor device according to embodiments of the present disclosure. Particularly, the method 100 relates to processes for patterning a dielectric layer and forming trench and via conductive features in the dielectric layer. FIGS. 2 to 7, 8A-8B, 9A-9B, 10A-10B, 11A-11B, 12A-12B, and 13-15 schematically illustrate a semiconductor device 200 at various stages of manufacturing according to the method 100. FIGS. 2-7, 8A, 9A, 10A, 11A, 12A, and 13-15 are schematic cross-sectional view of the semiconductor device 200. FIGS. 8B, 9B, 10B, 11B, and 12B are schematic top views of the semiconductor device 200.

The method 100 relates to patterning trench and via openings in a layer of dielectric material and forming trench and via conductive structures in the layer of dielectric material. The methods 100 may be used to perform a damascene process, such as a dual damascene process. In some embodiments, the trench and via conductive structures may be part of a metallization structure or an interconnect structure of a semiconductor device. The trench and via conductive structures may be formed from a metal. For example, the conductive lines formed using the techniques described herein may be used to form conductive interconnects as part of a Back End of Line (BEOL) process.

Figure 2:
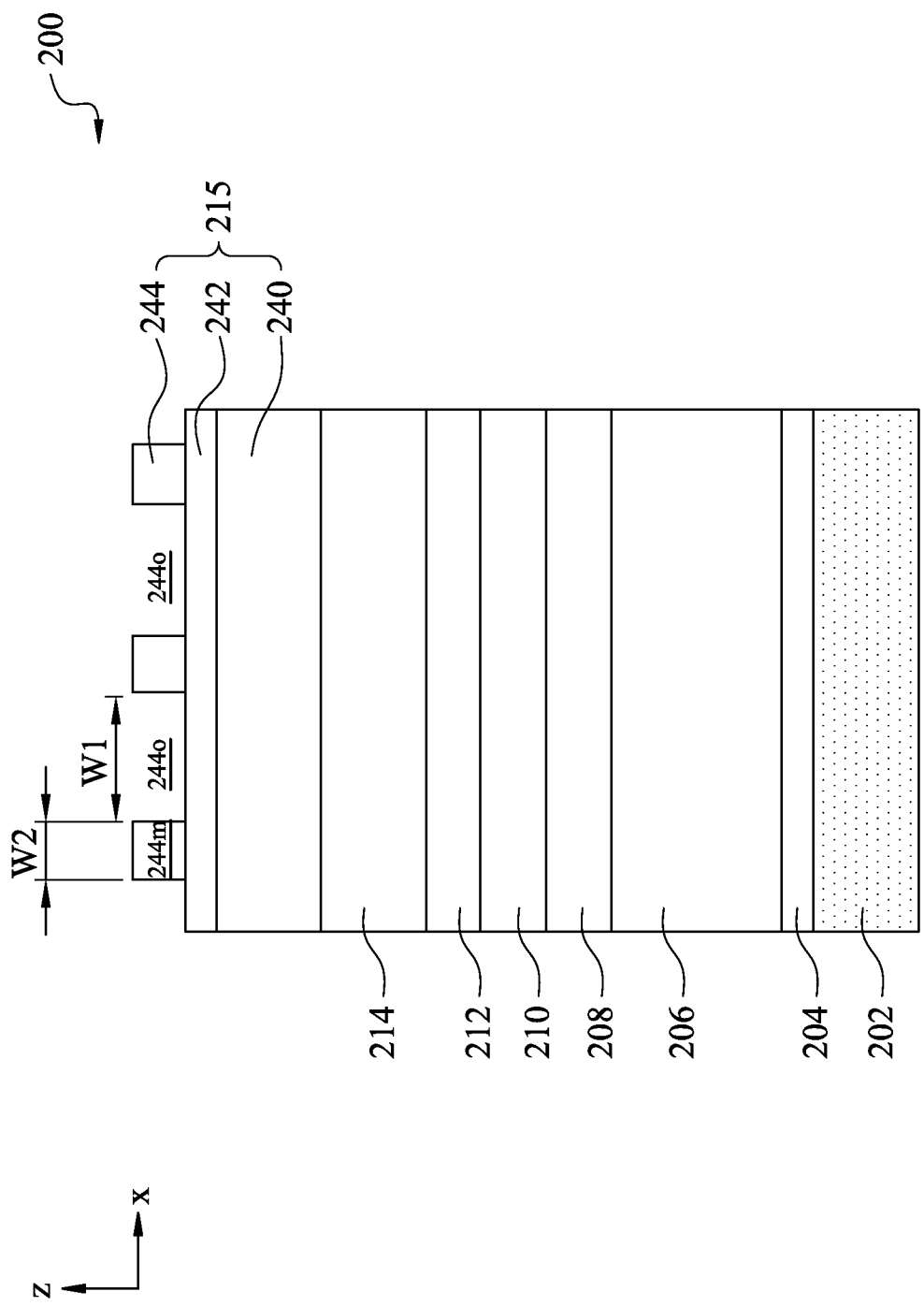
FIGS. 2 to 7, 8A-8B, 9A-9B, 10A-10B, 11A-11B, 12A-12B, and 13-15 schematically illustrate a semiconductor device at various stages of manufacturing according to the present disclosure.

In some embodiments, the semiconductor device 200 is processed as part of a larger wafer. As shown in FIG. 2, the semiconductor device 200 include a substrate 202. In some embodiments, the substrate 202 includes various features formed thereon and therein. For example, the substrate 202 may include active devices, interconnect structures, and the like.

The substrate 202 may include a semiconductor material such as silicon, doped or undoped, or an active layer of a semiconductor-on-insulator (SOI) substrate. The substrate 202 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices (not illustrated), such as transistors, such as planar transistors, field effect transistors (FETs), Fin-FETs, Horizontal Gate All Around (HGAA) FETs, Vertical Gate All Around (VGAA) FETs, and other suitable devices other types of transistors, diodes, capacitors, resistors, etc., may be formed in and/or on an active surface of semiconductor material in the substrate 202. Interconnect structures, such as interlayer dielectric layers, etch stop layers, IMD layers, may also be included in the substrate 202.

The semiconductor device 200 may include an etch stop layer 204 and a dielectric layer 206 formed over the substrate 202. Conductive features, such as conductive lines and vias, are to be formed in the dielectric layer 206 according to the method 100 described herein.

In some embodiments, the etch stop layer 204 may be a dielectric material with etch selectivity relative to the dielectric layer 206 and acts as an etch stop when etching the dielectric layer 206. The material and processes used to form the etch stop layer 204 may depend on the material of the dielectric layer 206. In some embodiments, the etch stop layer 204 may be formed of SiN, SiON, SiCON, SiC, SiOC, SiCN, SiO, other dielectrics, the like, or combinations thereof. The etch stop layer 204 may be formed by plasma enhanced chemical vapor deposition (PECVD), low pressure CVD (LPCVD), plasma vapor deposition (PVD), atomic layer deposition (ALD), or the like. Other materials and processes may be used.

In some embodiments, the dielectric layer 206 is an IMD (inter metal dielectric) layer. In some embodiments, the dielectric layer 206 may be formed over an inter-layer dielectric (ILD) layer formed over source/drain regions or the gate of a transistor (e.g., a FinFET), a dielectric layer in an interconnect structure, or a dielectric layer used in other types of metallization structures.

In some embodiments, the dielectric layer 206 includes one or more layers of dielectric material, for example, one or more layers of low-k dielectric material. The dielectric layer 206 may silicon oxide, un-doped silicate glass, doped silicon oxide such as borophosphosilicate glass (BPSG), fluorinated silicate glass (FSG), phosphosilicate glass (PSG), boron doped silicon glass (BSG), a polymer material and/or other suitable dielectric materials. The dielectric layer 206 may be formed by PECVD, low LPCVD, PVD, or other suitable deposition process. In some embodiment, the dielectric layer 206 may include silicon oxide formed using a tetraethylorthosilicate (TEOS) precursor in a PECVD process.

In some embodiments, the etch stop layer 204 may be omitted and the dielectric layer 206 may be in physical contact with the substrate 202. In other embodiments, any number of intervening layers may be disposed between the dielectric layer 206 and the substrate 202. Such intervening layers may include IMD layers or dielectric layers, and may have contact plugs, conductive lines, and/or vias formed therein, or may include one or more intermediary layers, e.g., additional etch stop layers, adhesion layers, etc., combinations thereof, and the like.

The method 100 may be used to pattern the dielectric layer 206 to form trench and via openings. In the example shown in FIGS. 2-15, the trench and via pattern is formed in the dielectric layer 206 using two photolithography processes. A first photolithograph process forms a first pattern with trench openings or line openings. A second photolithography process forms a second pattern with via openings aligned with the trench openings in the first pattern. The trench openings and via openings are patterned and then transferred to the dielectric layer 206 using a stack of hard mask layers. In some embodiments, the stack of hard mask layers including a metal containing hard mask layer sandwiched between two dielectric hard mask layers having different etch properties. In some embodiments, the hard mask stack includes a first hard mask layer 208, a second hard mask layer 210 formed on the first hard mask layer 208, and a third hard mask layer 212 formed on the second hard mask layer 210. The first hard mask layer 208 and third hard mask layer 212 are dielectric masks having high etch selectivity relative to each other, and the second hard mask layer 210 is a metal containing mask. In some embodiments, the first hard mask layer 208 contains oxygen and is nitrogen free while the third mask layer 212 is oxygen free.

In operation 102 of the method 100, the first hard mask layer 208 is deposited on the dielectric layer 206, as shown in FIG. 2. The first hard mask layer 208 may be formed of a material that includes an oxide material, e.g., silicon oxide, titanium oxide, silicon oxycarbide or the like, or a combination. In some embodiments, when the dielectric layer 206 includes a low-k material, the first hard mask layer 208 may be formed from a silicon oxide material. The first hard mask layer 208 may include more than one layer and include more than one material. In some embodiments, the first hard mask layer 208 is formed by a nitrogen-free material.

The first hard mask layer 208 may be formed using a process such as CVD, ALD, or the like. In some embodiments, the first hard mask layer 208 has a thickness between about between about 100 angstroms and about 300 angstroms. In other embodiments, the first hard mask layer 208 may have another thickness suitable for critical dimension of the features to be patterned in the dielectric layer 206 and the first hard mask layer 208.

In operation 104 of the method 100, the second hard mask layer 210 is formed over the first hard mask layer 208, as shown in FIG. 2. In subsequent processing steps, a pattern is formed on the second hard mask layer 210 using patterning techniques described herein. As discussed below, the second hard mask layer 210 is used as an etching mask for etching the first hard mask layer 208 and transferring the pattern of the second hard mask layer 210 to the first hard mask layer 208. The second hard mask layer 210 may be formed of a material containing one or more metal, such as tungsten, titanium nitride, titanium, tungsten carbide, titanium oxide, tantalum nitride, tantalum, or a combination.

The second hard mask layer 210 may be formed by a process such as CVD, ALD, or the like. Other processes and materials may be used. In some embodiments, the second hard mask layer 210 has a thickness between about 100 angstroms and about 300 angstroms. In other embodiments, the second hard mask layer 210 may have another thickness suitable for critical dimension of the features to be patterned in the dielectric layer 206, or in the first hard mask layer 208, or in the second hard mask layer 210.

In operation 106 of the method 100, the third hard mask layer 212 is formed over the second hard mask layer 210, as shown in FIG. 2. In subsequent processing steps, the third hard mask layer 212 functions as etch stops during etching of the first hard mask layer 208 and the dielectric layer 206, therefore, the third hard mask layer 212 includes material having etch selectivity relative to the first hard mask layer 208 and the dielectric layer 206. In some embodiments, the third hard mask layer 212 is oxygen free. For example, the third hard mask layer 212 may be a nitrogen containing dielectric material, such as silicon nitride (SiN), silicon carbon nitride (SiCN), or other nitrogen containing material. The third hard mask layer 212 may be formed using a process such as CVD, ALD, or the like.

In some embodiments, the third hard mask layer 212 has a thickness has a thickness between about 100 angstroms and about 300 angstroms. In other embodiments, the third hard mask layer 212 may have another thickness suitable for critical dimension of the features to be patterned in the dielectric layer 206, in the first hard mask layer 208, in the second hard mask layer 210, or in the third hard mask layer 212.

In operation 108 of the method 100, a mandrel layer 214 is formed on the third hard mask layer 212, as shown in FIG. 2. As discussed below, the mandrel layer 214 may be patterned to form mandrels as basis for a subsequent spacer pattern in a self-aligned double patterning (SADP) process.

In the SADP process, the mandrel layer 214 is removed from the third hard mask layer 212, thus, the mandrel layer 214 has a high etch selectivity relative to the third hard mask layer 212.

The mandrel layer 214 may include more than one layer and include more than one material. In some embodiments, the mandrel layer 214 may be a layer of carbon material, such as a layer of carbon deposited using a CVD process, a layer of spin-on-carbon material, or other type of carbon material. In some embodiments, the mandrel layer 214 include amorphous silicon formed by CVD, PVD, PECVD, or other suitable deposition methods. In some embodiments, the mandrel layer 214 contains a tin oxide. For example, the mandrel layer 214 may include an atomic ratio of tin to oxygen be about 1:2 (e.g., $SnO_2$). The mandrel layer 214 may be deposited using any suitable process, such as, ALD, CVD, PVD, or the like. In some embodiments, $Sn(CH_3)_4$ and $O_2$ are used as precursors during the deposition, and the deposition may be conducted at a temperature of about 1° C. to about 200° C. and at a pressure of about 1 Torr to about 10 Torr.

In some embodiments, the mandrel layer 214 has a thickness between about 200 angstroms and about 500 angstroms. In other embodiments, the mandrel layer 214 may have another thickness suitable for critical dimension of the features to be patterned in the dielectric layer 206, in the first hard mask layer 208, in the second hard mask layer 210, in the third hard mask layer 212, or in the mandrel layer 214.

Figure 3:
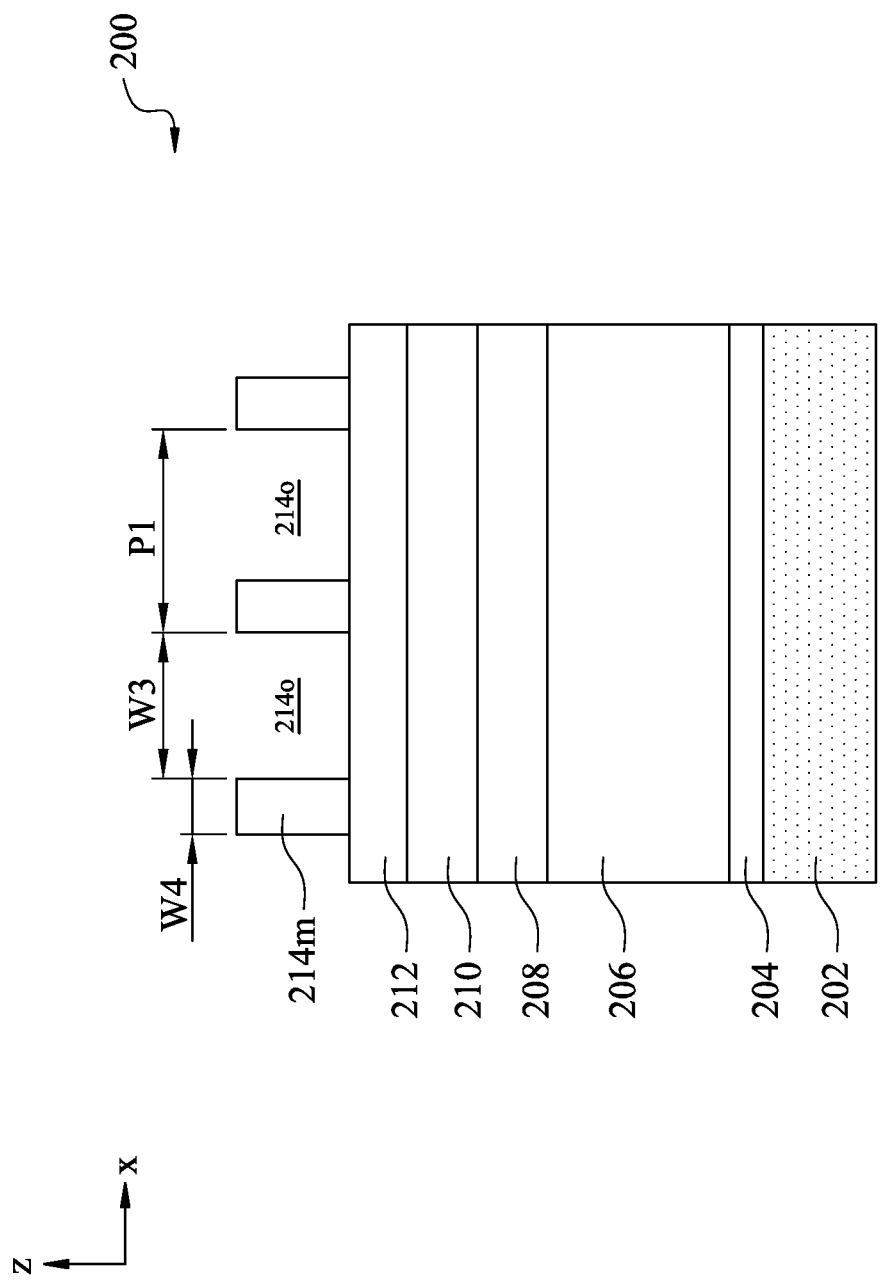

In operation 110 of the method 100, the mandrel layer 214 is patterned to form a plurality of mandrels 214m, as shown in FIG. 3. The mandrels 214m are defined from remaining portions of the mandrel layer 214. In some embodiments, the mandrels 214m may be a plurality of parallel strips formed along the y-direction and have a pitch P1 along the x-direction. In some embodiments, the pitch P1 is a minimum pitch achievable using photolithographic processes. The mandrels 214m may be formed by depositing and patterning a photoresist structure over the mandrel layer 214.

As shown in FIG. 2, a tri-layer photoresist 215 is formed on the mandrel layer 214. The tri-layer photoresist 215 includes a bottom layer 240, a middle layer 242 over the bottom layer 240, and an upper layer 244 over the middle layer 242. The upper layer 244 may be formed of photoresists. In some embodiments, the middle layer 242 may comprise an inorganic material, such as silicon nitride, silicon oxynitride, silicon oxide, or the like. The bottom layer 240 may be a bottom anti-reflective coating (BARC) layer. The middle layer 242 has a high etching selectivity relative to the upper layer 244 and the bottom layer 240. The various layers of the tri-layer photoresist 215 may be blanket deposited sequentially, for example, spin-on processes. Although the tri-layer photoresist 215 is discussed herein, other type of photoresists, such as a monolayer or a bilayer photoresist, may be used. The type of photoresist used may depend on the photolithography process used to pattern the mandrel layer 214.

A photolithography process is performed to pattern the upper layer 244 with a first pattern have a plurality of parallel lines with the pitch P1. Subsequently, the patterned upper layer 244 is used as an etching mask for patterning of the middle layer 242. The patterned middle layer 242 is then used as an etching mask for patterning of the bottom layer 240, and the patterned bottom layer 240 is then used to pattern the mandrel layer 214 forming the mandrels 214m separated by openings 214o, as shown in FIG. 3. It has been observed that by using a tri-layer photoresist to etch a target layer, e.g., the mandrel layer 214, improves definition in fine-pitched patterns formed in the target layer.

After a photolithography process is performed, a pattern including a plurality of mandrels 244m separated by openings 244o is formed in the upper layer 244. The pattern of the upper layer 244 is then transferred to the middle layer 242 in an etching process. In some embodiments, an anisotropic etch process is used so that openings 244o in the upper layer 244 are extended through the middle layer 242 in about substantially the same size. Optionally, a trimming process may be performed to increase the size of the openings 244o in the middle layer 242. In some embodiments, the trimming process may be an anisotropic plasma etch process with process gases including $O_2$, $CO_2$, $N_2/H_2$, $H_2$, the like, a combination thereof, or any other gases suitable for trimming the middle layer 242. The trimming process may increase a width $W_1$ of the openings 244o and decrease a width $W_2$ of the mandrels 244m the middle layer 242. An anisotropic etching process may be performed to transfer the pattern of the middle layer 242 to the bottom layer 240, thereby extending the openings 244o through the bottom layer 240.

The pattern of the bottom layer 240 is then transferred to the mandrel layer 214 using an anisotropic etching process so that the openings 244o in the bottom layer 240 are extended through the mandrel layer 214. As shown in FIG. 3, after the operation 110, the mandrel layer 214 have a pattern including the mandrels 214m with a width $W_4$ separated by openings 214o with a width $W_3$. In some embodiments, the width $W_4$ may be 20 nm or less. In some embodiments, trimming process may be performed to the middle layer 242 to achieve a desired ratio of the width $W_4$ to the width $W_3$ so that subsequently defined spacer lines are uniformly spaced. In other embodiments, the middle layer 242 is initially patterned to have a desired ratio of the width $W_4$ to the width $W_3$ and the trimming process may be omitted.

The mandrel layer 214 may be etched by any suitable etch process, such as a dry etch process. In some embodiments, when the mandrel layer 214 is formed from tin oxide, a hydrogen-containing etchant with hydrogen as the reactive component may be used as an etchant. For example, the etchant may include hydrogen ($H_2$) or hydrogen in combination with HBr, $NH_3$, or the like as an active etchant. In some embodiments, the etchant may include other processes gases, such as Ar, $N_2$, or combinations thereof, as carrier gases. In some embodiments, when the mandrel layer 214 includes tin oxide, the mandrel layer 214 is etched using a $H_2$ plasma. In other embodiments, a different reactant, e.g., chlorine ($Cl_2$), may be used to etch the mandrel layer 214. In some embodiments, for example, where the mandrel layer 214 is formed of amorphous silicon, the mandrel layer 214 may etched by a reactive ion etch (RIE) process with etch process gases including a form of fluorine, such as $CHF_3$, $CF_4$, $CH_2F_2$, $SF_3$, the like, or a combination thereof. Additional process gasses may be used, such as Ar, $N_2$, $O_2$, and the like, or a combination thereof.

The third hard mask layer 212 under the mandrel layer 214 functions an etch stop layer when patterning the mandrel layer 214. The third hard mask layer 212 may be used as etch stop layers because the material of the mandrel layer 214 can be patterned with a chemical etchant, e.g., a hydrogen-containing gas, that does not significantly etch the third hard mask layer 212, which includes SiN, or SiCN.

Figure 4:
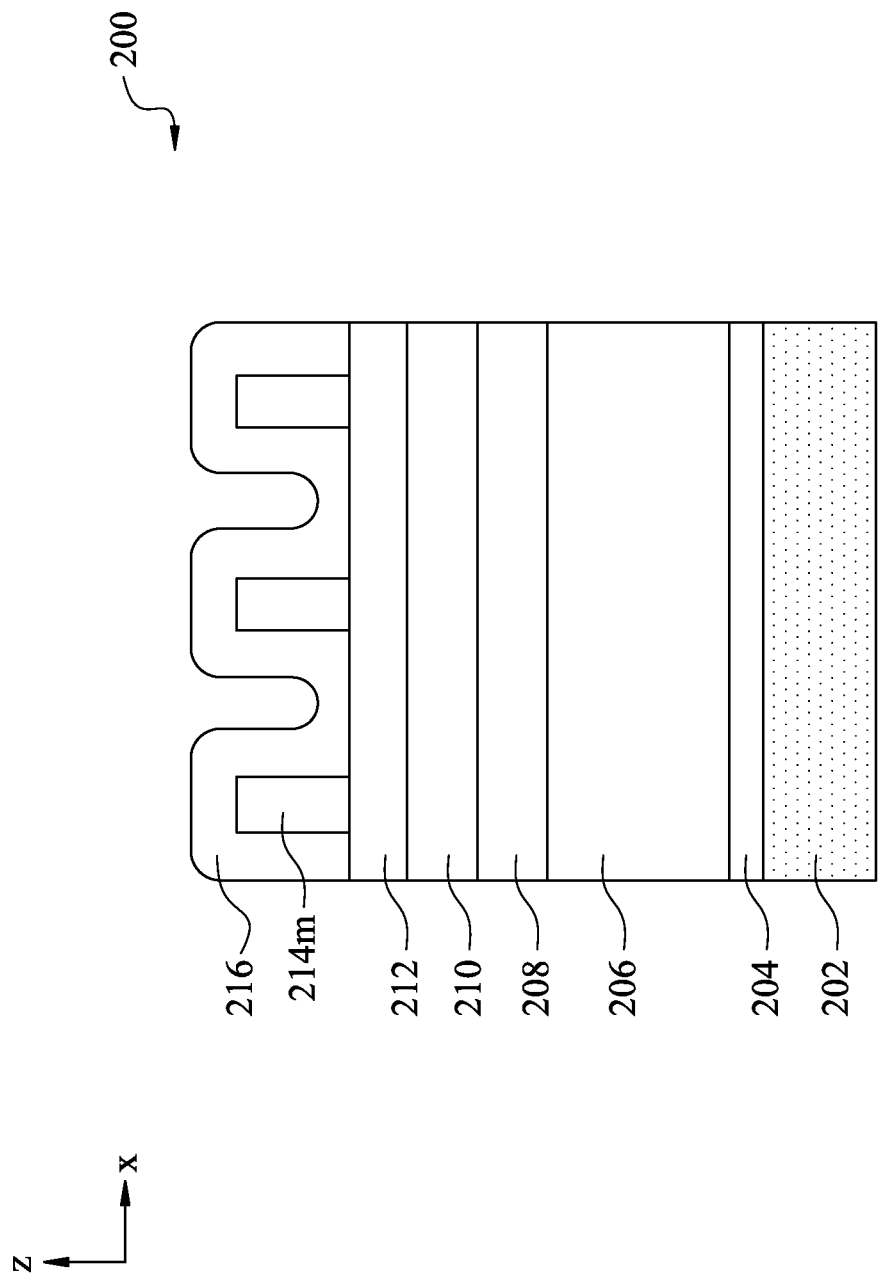
Figure 5:
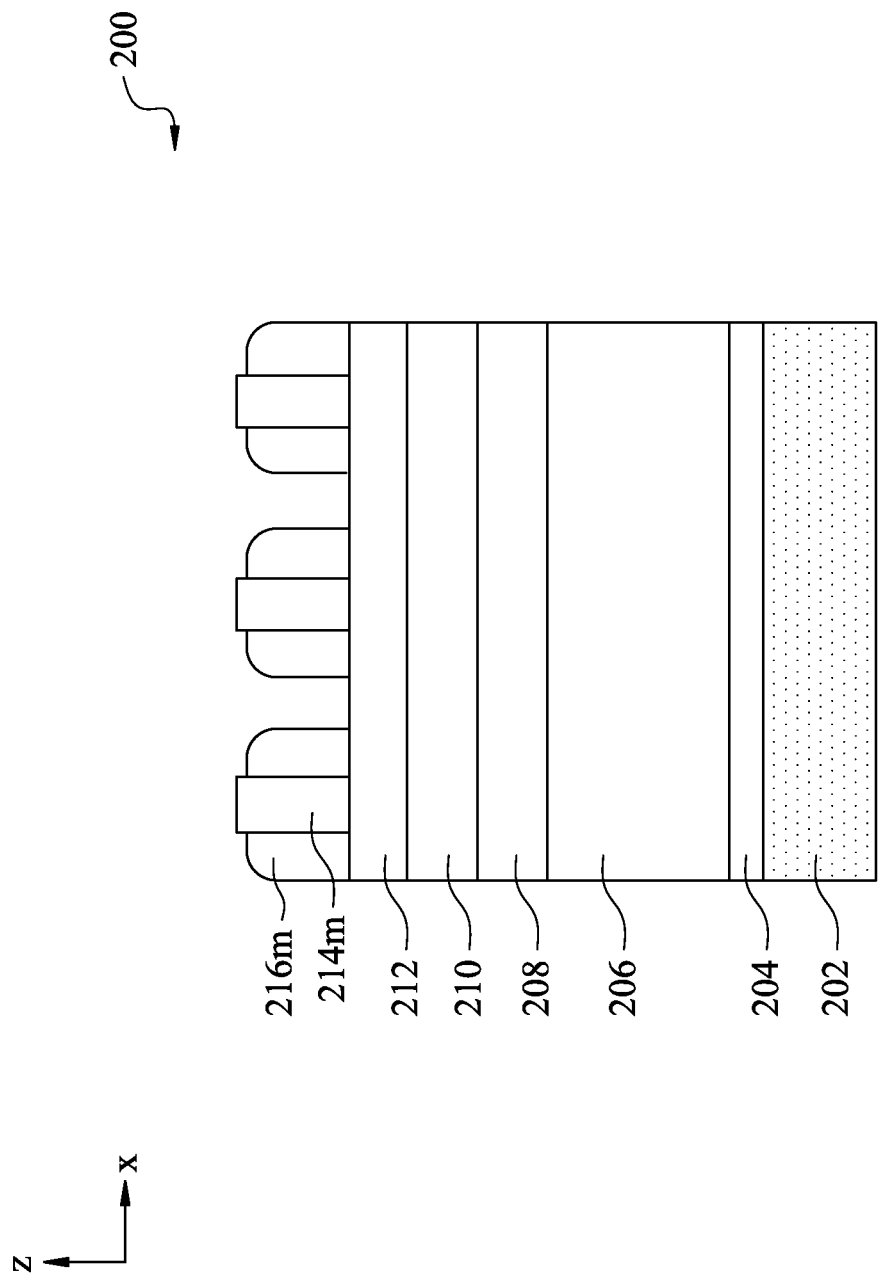

In operation 112, a spacer layer 216 on the patterned mandrel layer 214, as shown in FIG. 4, and spacer mandrels 216m are then formed over and along sidewalls of the mandrels 214m, as shown in FIG. 5. In some embodiments, the spacer layer 216 may be deposited on all exposed surfaces, including on exposed surfaces of the third hard mask layer 212 in the openings 214o and top surfaces of the mandrels 214m. The material of the spacer layer 216 is selected to have a high etching selectivity with the third hard mask layer 212 and the mandrels 214m. For example, the spacer layer 216 may be comprise an oxide, such as SiO, TiO.

The spacer layer 216 may be deposited using any suitable process such as ALD, CVD, or the like. In some embodiments, the deposition process of the spacer layer 216 is conformal so that a thickness of the spacer layer 216 on sidewalls of the mandrels 214m is substantially equal of a thickness of the spacer layer 216 on the top surface of mandrels 214m and bottom surfaces of the openings 214o.

The spacer layer 216 is patterned to remove lateral portions of the spacer layer 216 while leaving the spacer mandrels 216m on sidewalls of the mandrels 214m, as shown in FIG. 5. Etching the spacer layer 216 exposes the mandrels 214m and portions of the third hard mask layer 212. Patterning the spacer layer 216 may include a dry etch process, which selectively etches the spacer layer 216 at a higher rate than the mandrels 214m and the third hard mask layer 212. Because the spacer layer 216 includes oxide material, the spacer layer 216 may be etched using an etchant having high etch rate for etching oxide materials. Example etchants for etching the spacer layer 216 may include $CF_4$, or $CHF_3$, or other fluorine containing gas. The dry etch process may be anisotropic, such as a RIE process.

Figure 6:
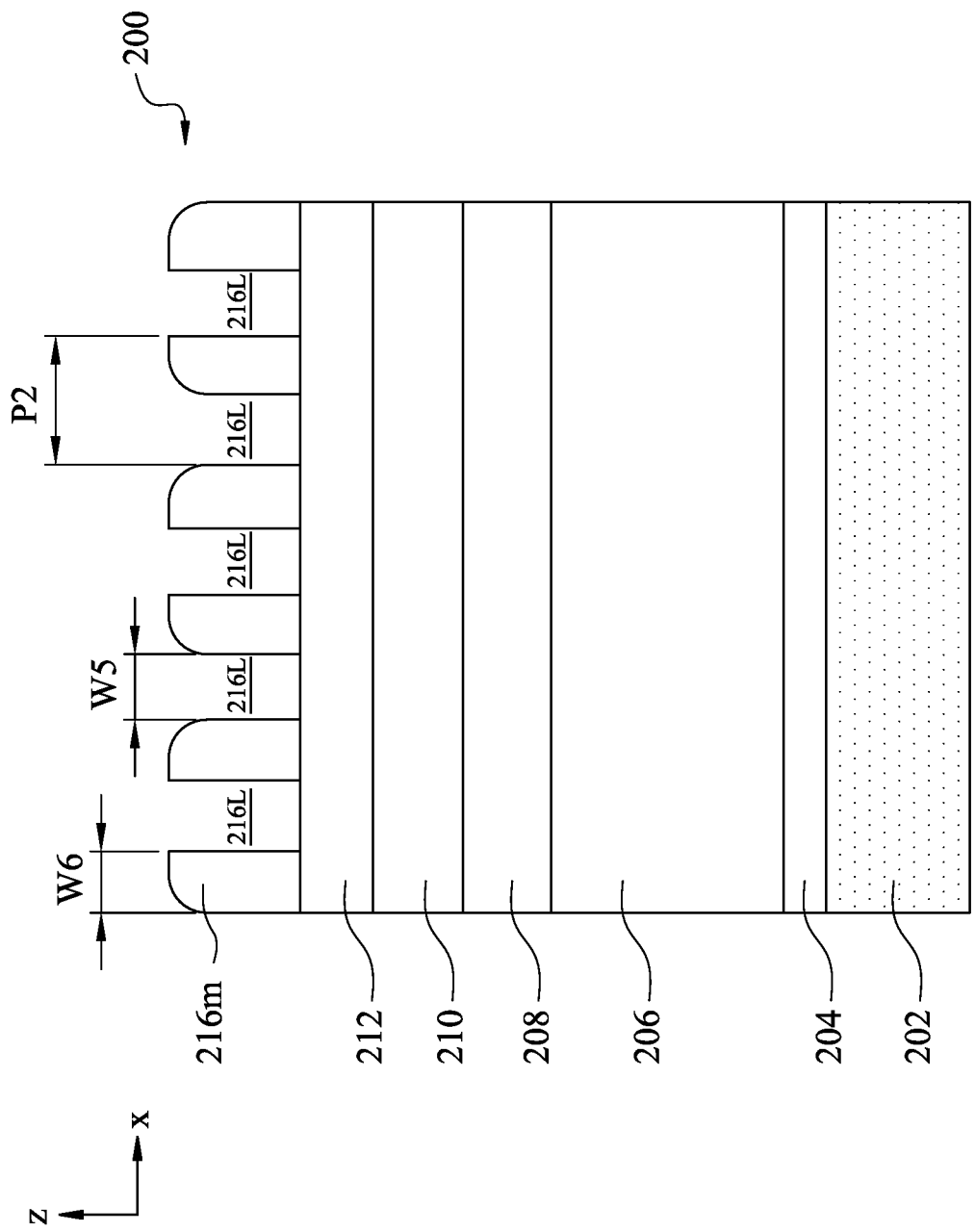

In operation 114, the mandrels 214m are removed to form a trench pattern with the spacer mandrels 216m separated by openings 216L, as shown in FIG. 6. The mandrels 214m are removed using an etching process. Because the mandrels 214m and the spacer mandrels 216m have etch selectivity relative, the mandrels 214m may be removed without removing the spacer mandrels 216m. Etching the mandrels 214m exposes the underlying third hard mask layer 212, which may act as an etch stop layer. In some embodiments, etching the mandrels 214m may reduce a height of the spacer mandrels 216m without removing the spacer mandrels 216m. Removing the mandrels 214m may use a dry etch process similar to the process used to pattern the mandrels 214m as described in operation 110. For example, the dry etch process may use a hydrogen-containing reactive gas to selectively remove the mandrels 214m while leaving the spacer mandrels 216m. However, a chemical composition of the etchant used to remove the mandrels 214m may the same or different as a chemical composition of the etchant used to pattern the mandrels 214m.

After some or all of the mandrels 214m are removed, the spacer mandrels 216m may have a pitch P2. In some embodiments, the pitch P2 may be below about 30 nm. In embodiments where a SADP process as described above is employed, the pitch P2 may be one half of a minimum pitch achievable by photolithographic processes. In some embodiments, the pattern defined by the spacer mandrels 216m is a negative of subsequently formed conductive lines. For example, the openings 216L correspond to a pattern of subsequently formed conductive lines. Each of the spacer mandrels 216m may have a width W6 and each the openings 216L may have a width W5. The summation of the width W5 and the width W6 equals the pitch P2. In some embodiments, the width W6 may be in a range between about 40% to about 60% of the pitch P2. A width W6 less than 40% of the pitch P2 may not result in robust enough spacer mandrels for the subsequent processing, and a width W6 greater than 60% of the pitch P2 may result in thin conductive lines thus increasing resistance of the conductive lines.

In some embodiments, the operations 112 and 114 may be omitted, and the mandrels 214m formed in operation 110 may be used directly as an etching mask and transferred to the third hard mask layer 212 as described below.

Figure 7:
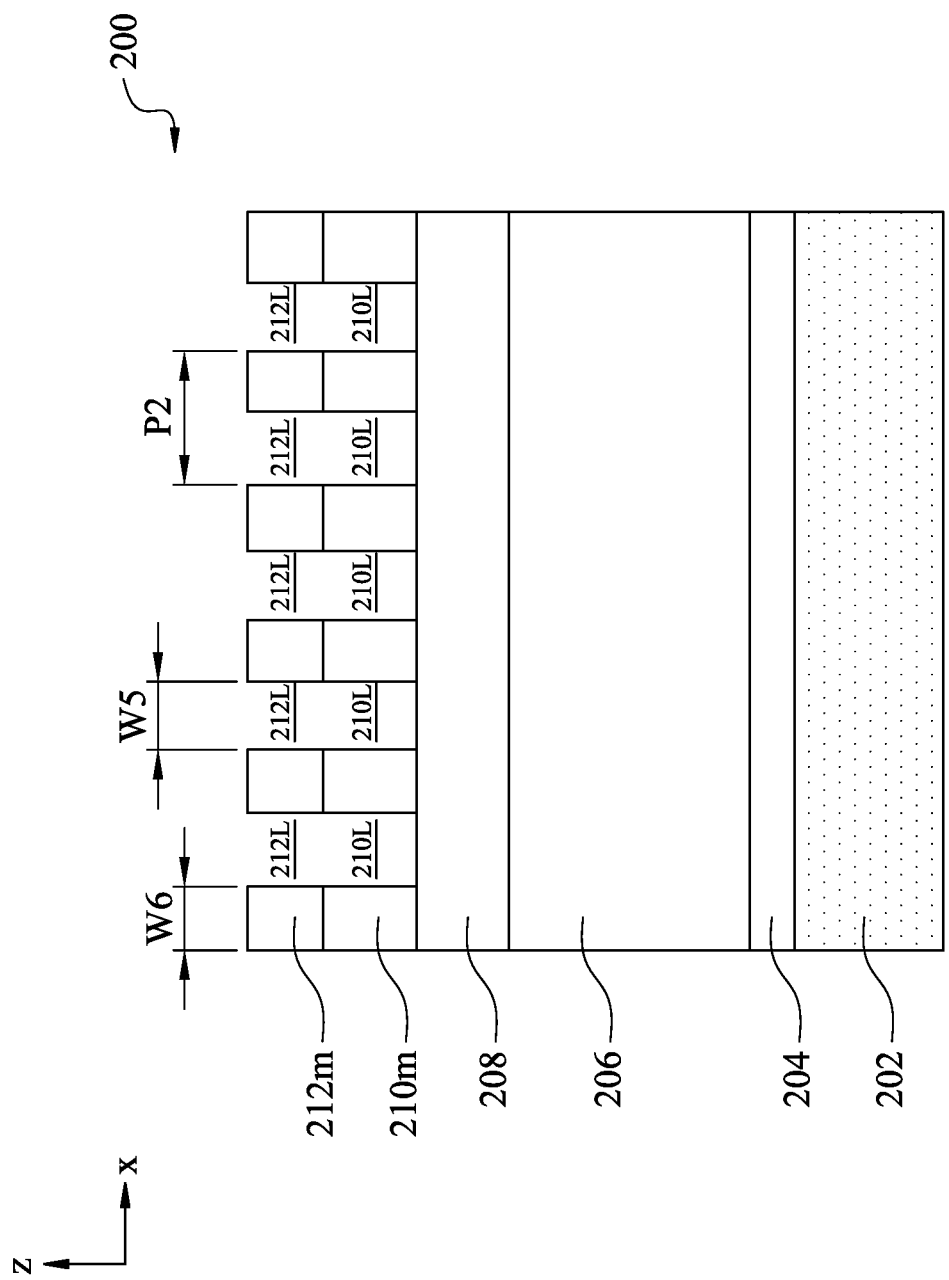

In operation 116, the pattern of the spacer mandrels 216m is transferred to the third hard mask layer 212 and the second hard mask layer 210, as shown in FIG. 7. The openings 216L separating the spacer mandrels 216m are extended through the third hard mask layer 212, and the second hard mask layer 210, forming openings 212L/210L and mask strips 212m/210m, and exposing a portion of the first hard mask layer 208.

The pattern of the spacer mandrel layer 214 is first transferred to the third hard mask layer 212 in a suitable etching process. As shown in FIG. 7, after operation 116, a plurality of mask strips 212m are formed in the third hard mask layer 212. The mask strips 212m separated by the openings 212L are formed in through the third hard mask layer 212. The openings 212L have about the same size of the opening 216L. The etching process may be anisotropic, so that the openings 216L between the spacer mandrels 216m extend through the third hard mask layer 212 and the openings 212L in the third hard mask layer 212 and the openings 216L have substantially the same size.

The etching process used to etch the third hard mask layer 212 may include a wet etching process, a dry etching process, or a combination. Because the third hard mask layer 212 includes an oxygen free material, and the spacer mandrels 216m includes oxides, the third hard mask layer 212 may be selectively etched using an oxidizing agent using the spacer mandrels 216m as an etching mask and the second hard mask layer 210 as an etch stop layer. In some embodiments, the third hard mask layer 212 may be etched using a plasma of oxygen ($O_2$). In other embodiments, the third hard mask layer 212 is etched using a plasma etching process may include one or more process gases such as $CF_4$, $NF_3$, other suitable gas, or a combination.

After the etching of the third hard mask layer 212, portions of the spacer mandrels 216m may remain. In some embodiments, the remaining portions of the spacer mandrels 216m may be removed using a suitable etching process, for example, a wet etching process known as BOE (buffered oxide etch) using solution of hydrofluoric acid (HF) and ammonium fluoride ($NH_4F$). In other embodiments, the remaining portions of the spacer mandrels 216m may be removed using a dry etching process with an etchant including $CF_4$ and $H_2$.

After removal of the spacer mandrels 216m, the pattern in the third hard mask layer 212 is transferred to the second hard mask layer 210 by a suitable etching process. The etching process may be anisotropic, so that the openings in the third hard mask layer 212 are extended through the second hard mask layer 210 with substantially the same size. As shown in FIG. 7, after operation 116, a plurality of mask strips 210m are formed in the second hard mask layer 210. Neighboring mask strips 210m are separated by openings 210L. The openings 210L have about the same size of the opening 212L.

In some embodiments, the second hard mask layer 210, which includes a metal-containing material, may be etched a plasma process, such as an inductively coupled plasma (ICP), parallel plate plasma, ion beam etching (IBE), or reactive ion beam etching (RIBE) plasma process. In some embodiments, the second hard mask layer 210 is etched by a plasma etch with a fluorine containing gas, such as $CF_4$ and/or CHF$_3$, with a carbon containing gas, such as CH$_4$, and with a chlorine containing gas, such as Cl$_2$.

As shown in FIG. 7, after operation 116, the pitch of the mask strips 212m/210m and the openings 212L/210L is the pitch P2. The width of the mask strips 212m/210m substantial equals to the width W6 and the width of the openings 212L/210L substantially equals to the width W5.

In operation 118, a tri-layer photoresist 217 is disposed over the patterned hard mask layers 212, 210, and 208, and a via pattern formed in the tri-layer photoresist 217 as shown in FIGS. 8A-8B and 9A-9B. The tri-layer photoresist 217 may be similar to the tri-layer photoresist 215 described above.

In some embodiments, the tri-layer photoresist 217 may be selected to be suitable for an extreme ultraviolet (EUV) photolithography. The photoresist 217 may include a bottom layer 218, formed over the first hard mask layer 208 and between the openings 212L/210L in the patterned hard mask layers 210, and 212, a middle layer 220 formed over the bottom layer 218, and an upper layer 222 formed over the middle layer 220. The upper layer 222 is a photoresist layer. In other embodiments, one or both of the bottom layer 218 and middle layer 220 may be omitted forming a double-layer photoresist structure, or a mono-layer photoresist structure.

The bottom layer 218 may be a material such as spin-on-carbon (SOC), silicon oxycarbide (SiOC), silicon, silicon oxynitride, titanium oxide, silicon oxide, silicon nitride, a polymer, or a combination. The bottom layer 218 contains a material that is patternable and/or has a composition tuned to provide anti-reflection properties. The bottom layer 218 may be formed by a spin coating process so that the bottom layer 218 fills in the openings 210L/212L. The bottom layer 218 may have a thickness between about 50 angstroms and about 300 angstroms.

The middle layer 220 may have a composition that provides anti-reflective properties and/or hard mask properties for the lithography process. In one embodiment, the middle layer 220 includes a silicon containing layer, e.g., silicon hard mask material. The middle layer 220 may include a silicon-containing inorganic polymer. In other embodiment, the middle layer 220 includes a siloxane polymer, e.g., a polymer having a backbone of O—Si—O—Si. The silicon ratio of the middle layer 220 may be selected to control the etch rate. In other embodiments, the middle layer 220 may include silicon oxide, e.g., spin-on glass (SOG), silicon nitride, silicon oxynitride, polycrystalline silicon, a metal-containing organic polymer material that contains metal such as titanium, titanium nitride, aluminum, and/or tantalum; and/or other suitable materials. The middle layer 220 may be omitted when there is a good adhesion between the bottom layer 218 and the upper layer 222. The middle layer 220 may have a thickness between about 50 angstroms and about 300 angstroms.

The upper layer 222 may be a positive photoresist layer or a negative photoresist layer. In some embodiments, the upper layer 222 is made of Poly methyl methacrylate (PMMA), poly methyl glutarimide (PMGI), Phenol formaldehyde resin (DNQ/Novolac) or SU-8. In one embodiment, the upper layer 222 may have a thickness between about 200 angstroms and about 500 angstroms.

Figure 8A:
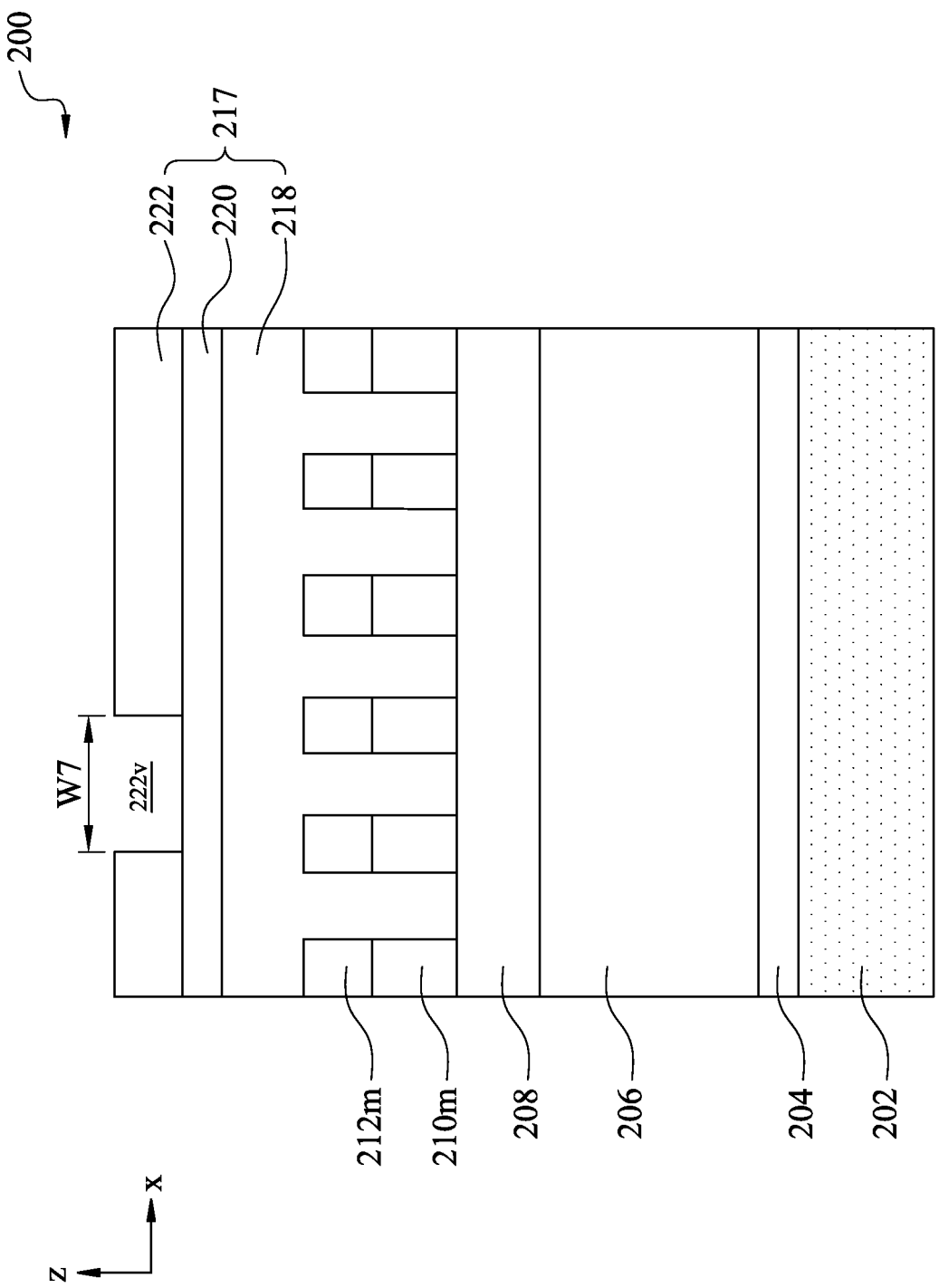
Figure 8B:
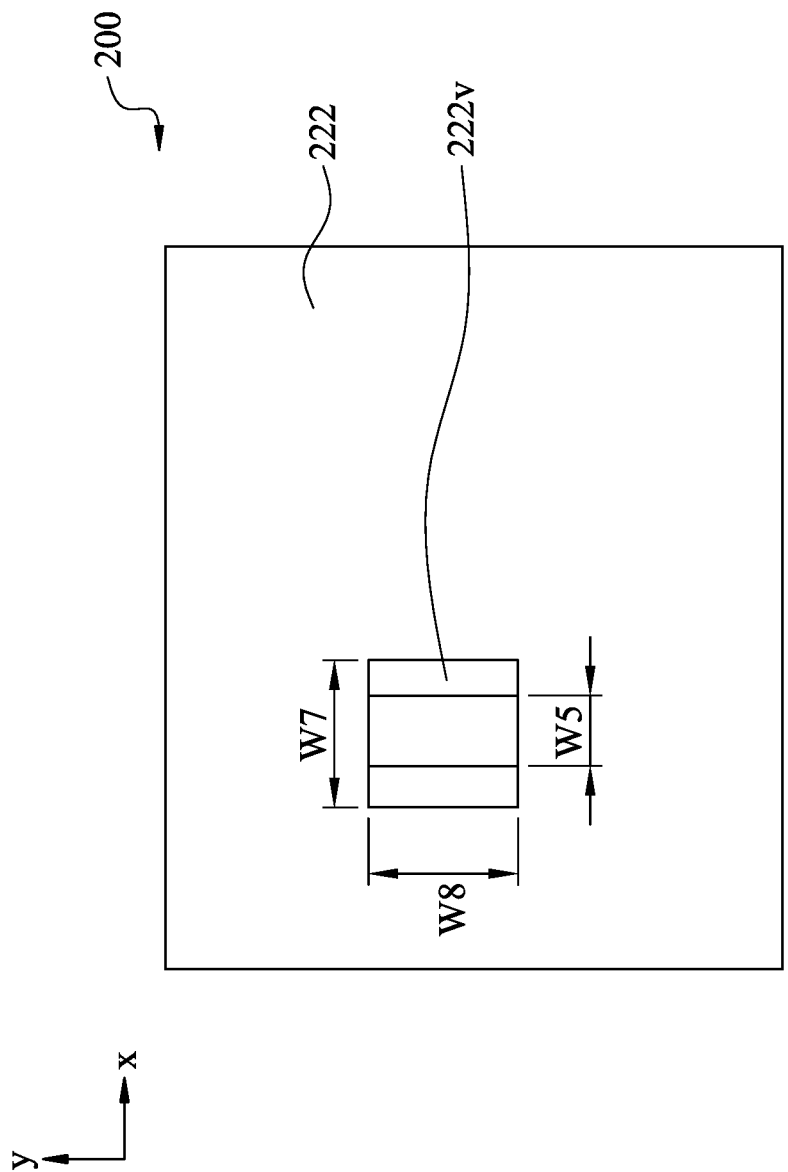

In operation 118 of the method 100, the upper layer 222 is patterned using a photolithography process, as shown FIGS. 8A-8B. In some embodiments, the upper layer 222 may be patterned using an extreme ultraviolet (EUV) lithography process, which uses extreme ultraviolet radiation or soft x-ray, i.e. radiation with wavelength shorter than 130 nm, has become one of the lithography methods for forming smaller semiconductor devices.

The upper layer 222 is patterned with a second pattern, which includes one or more via openings 222v. The openings 222v expose the middle layer 220 if present or the bottom layer 218 if the middle layer 220 is not present. As shown in FIG. 8B, the via openings 222v may have a width W7 along the x-direction and a width W8 along the y-direction. The width W8 may be the same or different from the width W7. The via opening 222v is shown as a rectangular opening in FIG. 8B. However, the via openings 222v may have other shapes, such as circular, oval, or square shapes.

Figure 9A:
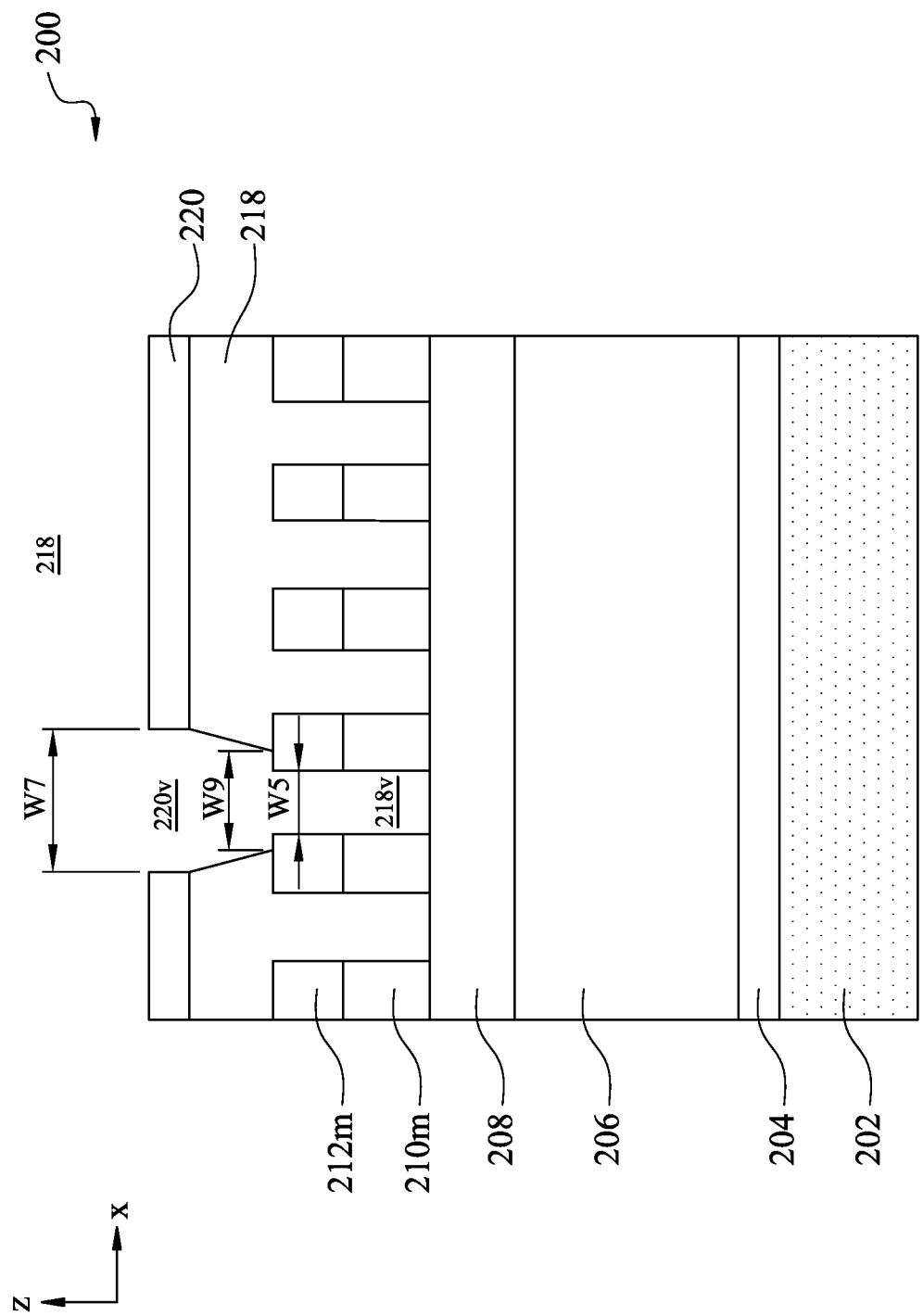
Figure 9B:
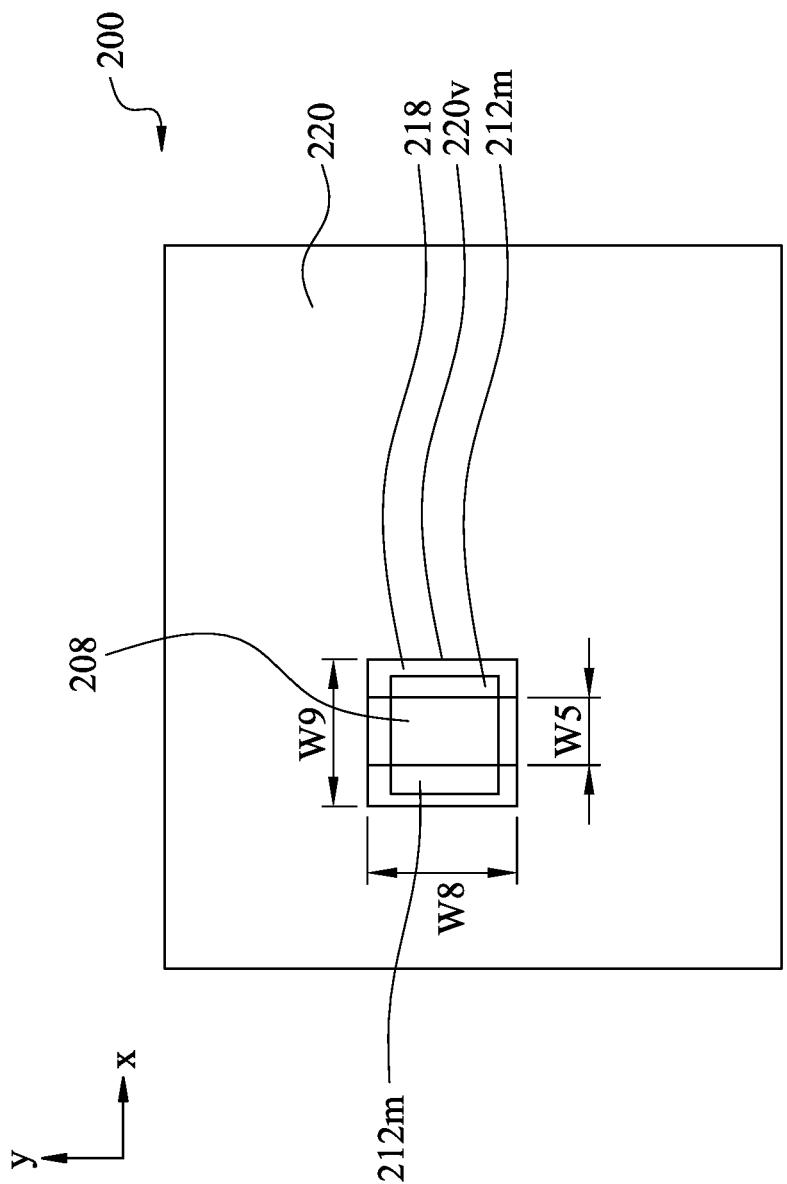

Subsequently, the patterned upper layer 222 is used as an etching mask for patterning of the middle layer 220. The patterned middle layer 220 is then used as an etching mask for patterning of the bottom layer 218, and the patterned bottom layer 218 is then used to pattern the first hard mask layer 208, as shown in FIGS. 9A and 9B.

In some embodiments, an anisotropic etch process is used so that openings 222v in the upper layer 222 are extended through the middle layer 220 to form via openings 220v. The via openings 222v and 220v are in about substantially the same size. An etching process may be performed to transfer the pattern of the middle layer 220 to the bottom layer 218 to form via openings 218v in the bottom layer 218. The via opening 218v may have a width W9 at the level of the third hard mask layer 212. As shown in the FIG. 9A, due to the high aspect ratio of the via openings 218v, the via opening 218v may shrink along the z-direction, resulting in the width W9 at the level of the third hard mask layer 212 smaller than the width W7. The difference between the width W9 and width W7 may be referred to as "process shrinkage".

The via opening 222v is positioned to align with one of the openings 212L/210L so that an opening may be formed through the first hard mask layer 208 at the bottom of the corresponding opening 212L/210L. In order to align the via opening 222v with the target opening 212L/210L, the width W7 of the via opening 222v is selected to be equal or greater than the width W5 to provide tolerance to an overlay error and tolerance to process shrinkage discussed above. In some embodiments, the width W7 may be greater than the width W5 by a tolerance amount in a range between about 3 nm to about 50% of the pitch P2. When the tolerance amount is less than about 3 nm, the via opening 222v may not be able to align with the target opening 212L/210L due to overlay error. When the tolerance amount is greater than about 50% of the pitch P2, the via opening 222v may connect to two neighboring line openings 212L/210L causing short circuits in resulting conductive features.

In some embodiments, the minimum dimension of the width W7 is one half of a minimum pitch achievable by the photolithographic processes used to pattern the upper layer 222. As discussed above, the pitch of the mask strips 212m/210m and the openings 212L/210L is the pitch P2, which may be one half of a minimum pitch achievable by photolithographic processes. The width W5 of the openings 212L/210L may be between 40% to 60% of the pitch P2. When the pitch of the openings 212L/210L is half of the minimum pitch achievable by the photolithographic process, the width W7 of the via opening 222v is in a range between the pitch P2 and the summation of the pitch P2 and the process shrinkage.

As shown FIGS. 9A-9B, after patterning the tri-layer photoresist 217, the via opening 218v is formed through the bottom layer 218 and exposes a portion of the first hard mask layer 208. Because the width W7 is selected to allow that width W9 of the via opening 218v at the level of the third hard mask layer 212 greater than the width W5 of the opening 212L/210L, the via opening 218v exposes a portion of the third hard mask layer 212 on one or both sides of the via opening 218v.

Figure 10A:
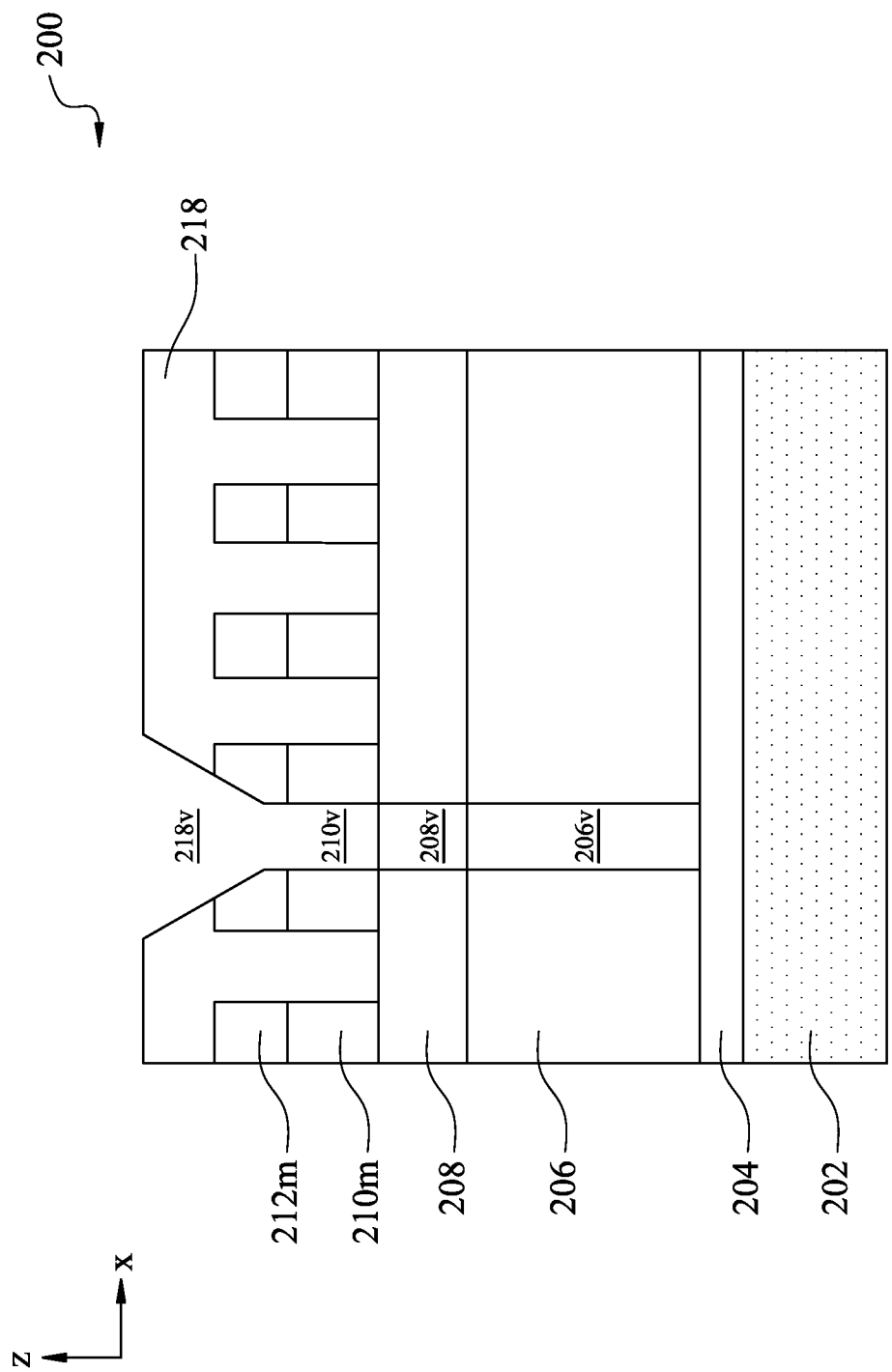
Figure 10B:
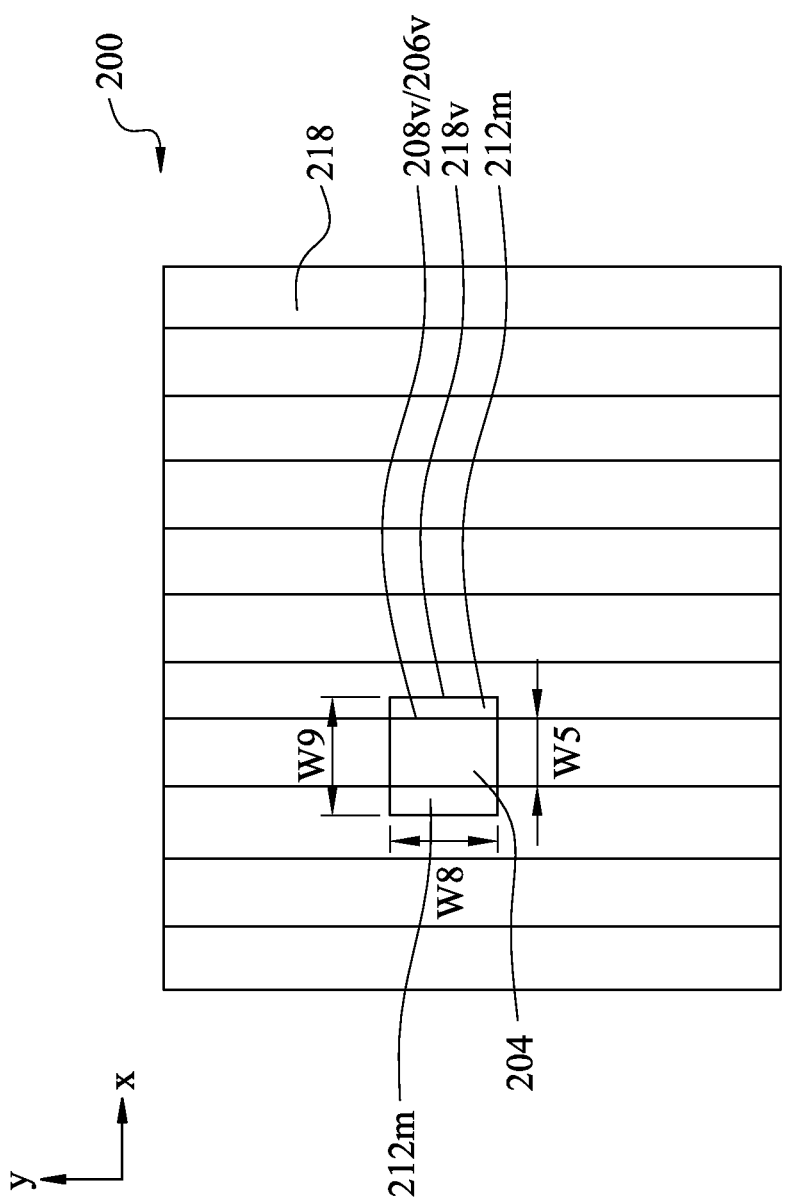

In operation 120, the via pattern formed in the tri-layer photoresist 217 is transferred to the dielectric layer 206 through one or more etching processes, as shown in FIGS. 10A-10B and 11A-11B. The bottom layer 218 is used as an etching mask to progressively transfer the pattern of bottom layer 218 to the first hard mask layer 208, and the dielectric layer 206, which is the target layer forming via openings 208v, 206v. The etch stop layer 204 is exposed at the bottom of the via opening 206v. As shown in FIG. 10B, the via opening 208v/206v has a width equal to the width W5 along the x-direction. The via opening 208v/206v has a width equal to the width W8 along the y-direction.

The first hard mask layer 208 and the dielectric layer 206 may be etched in the same process or with separate processes. In some embodiments, a plasma or RIE anisotropic etch may be used to form the via opening 208v/206v to achieve relatively uniform dimension. In some embodiment, a RIE process using an etchant having high etch rate over oxide may be used. Example etchants may include $CF_4$, or $CHF_3$, or other fluorine containing gas. In other embodiments, the first hard mask layer 208 and the dielectric layer 206 may be etched using any suitable etching process, for example, a wet etching process known as BOE (buffered oxide etch) using solution of hydrofluoric acid (HF) and ammonium fluoride ($NH_4F$). In other embodiments, the first hard mask layer 208 and the dielectric layer 206 may be removed using a dry etching process with an etchant including $CF_4$ and $H_2$.

Because the third hard mask layer 212 is an oxygen free layer, the etch chemistry used to etch the oxygen containing first hard mask layer 208 and the dielectric layer 206 etches the third hard mask layer 212 very slowly. As a result, the exposed third hard mask layer 212 acts as an etch mask protecting the second hard mask layer 210 underneath during the etch process to form the via openings 208v/206v.

Hard mask stacks according to state-of-the-art technology, both the first hard mask layer and the third hard mask layer both include oxide based dielectric material, usually formed from the same material. This is because the spacer mandrels are conventionally formed from silicon nitride for convenience of fabrication, and to achieve etch selectivity between the spacer mandrels and the third hard mask layer, the third hard mask layer needs to be oxide based. As critical dimension reduces, to cope with overlay tolerance and/or lithography limitation, the via opening formed in photoresist layer is wider than the trench opening, resulting in a portion of the third hard mask layer is exposed after patterning via openings. The exposed third mask layer will be etched at the same rate as the first hard mask layer and the dielectric layer, resulting in damage or loss of the second hard mask layer, or the metal containing hard mask layer, which may lead to breakdown of conductive lines with vias. By selecting materials with high etch selectivity for the first hard mask layer 208 and the third hard mask layer 212, embodiments of the present disclosure enable pitch reducing without incur damages to conductive lines.

Figure 11A:
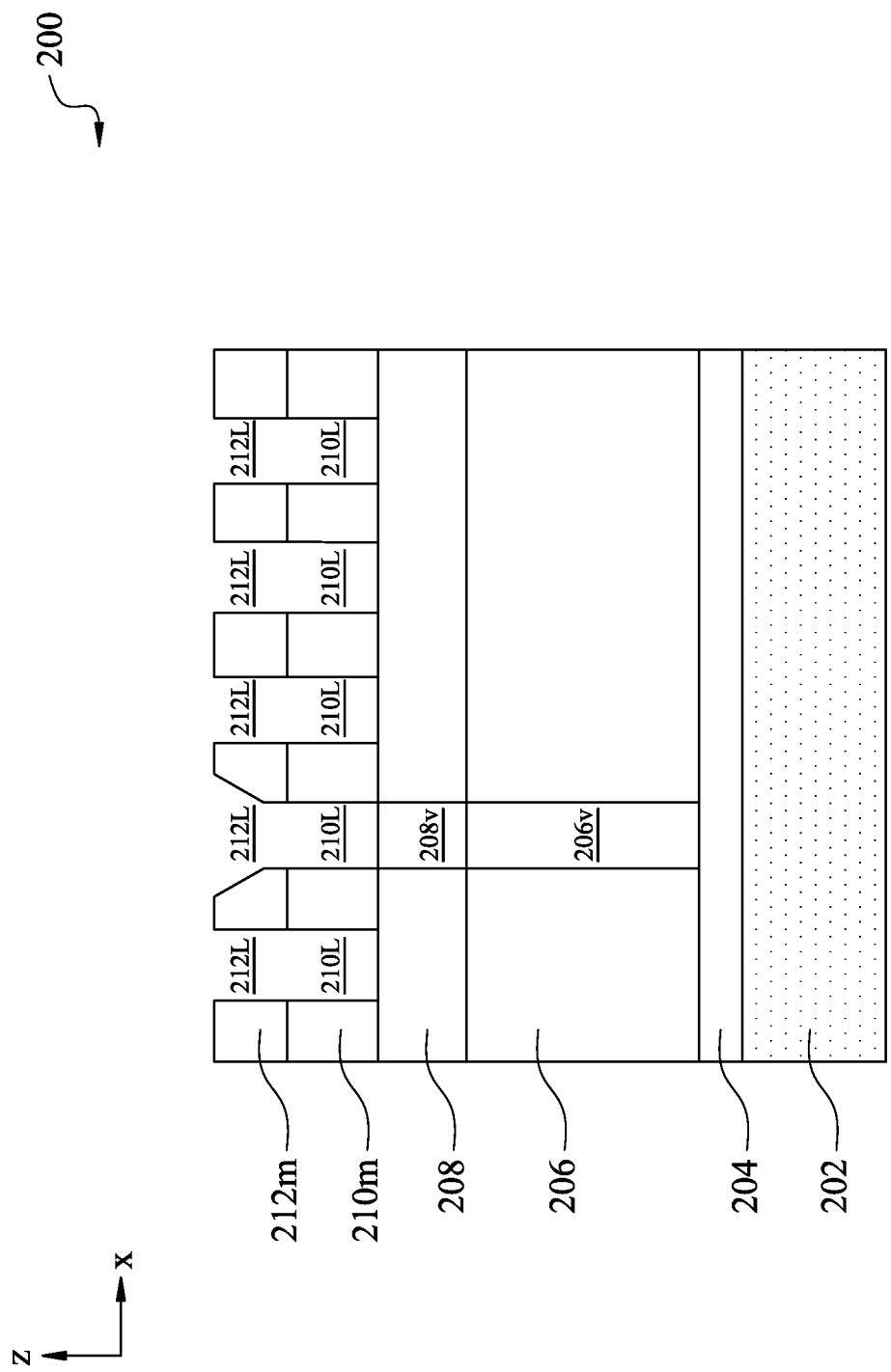
Figure 11B:
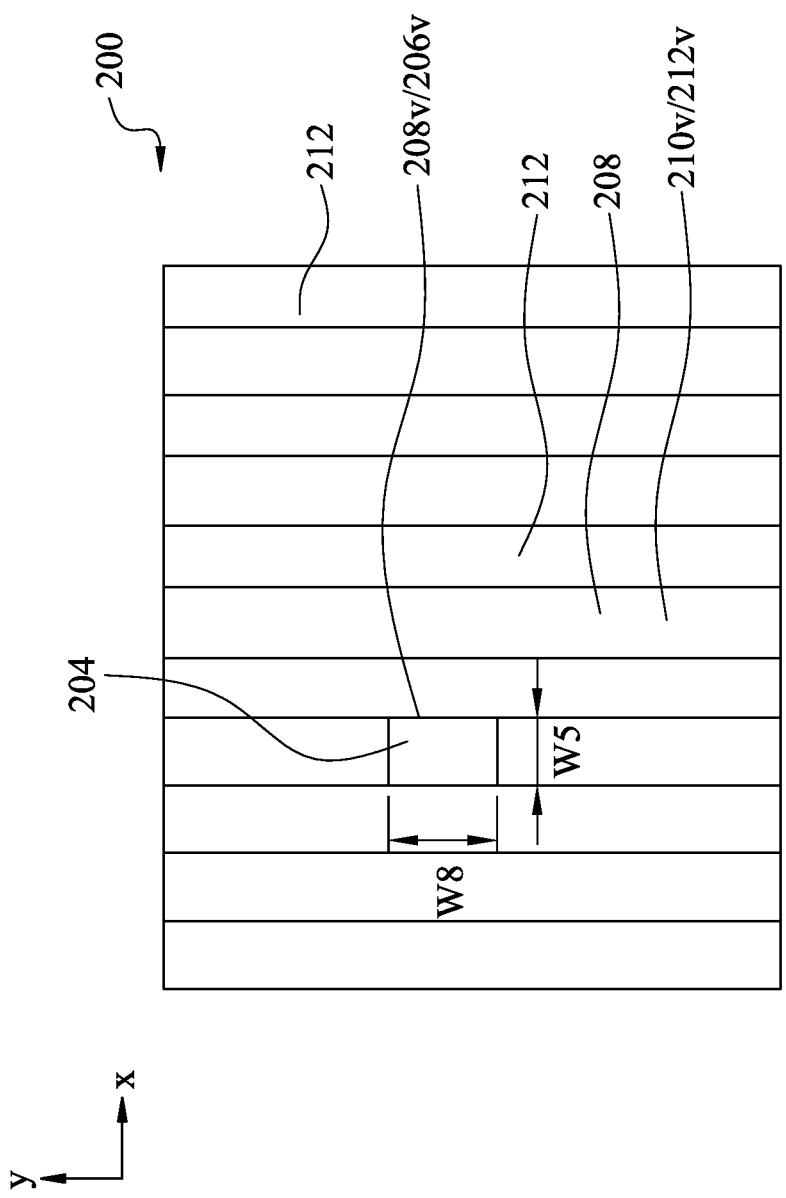

During etching of the first hard mask layer 208 and the dielectric layer 206, the middle layer 220 is consumed. After formation of the via openings 208v/206v, an ashing process may be performed to remove the bottom layer 218 of the tri-layer photoresist 217, exposing the line openings 212L/210L, as shown in FIGS. 11A-11B.

Figure 12A:
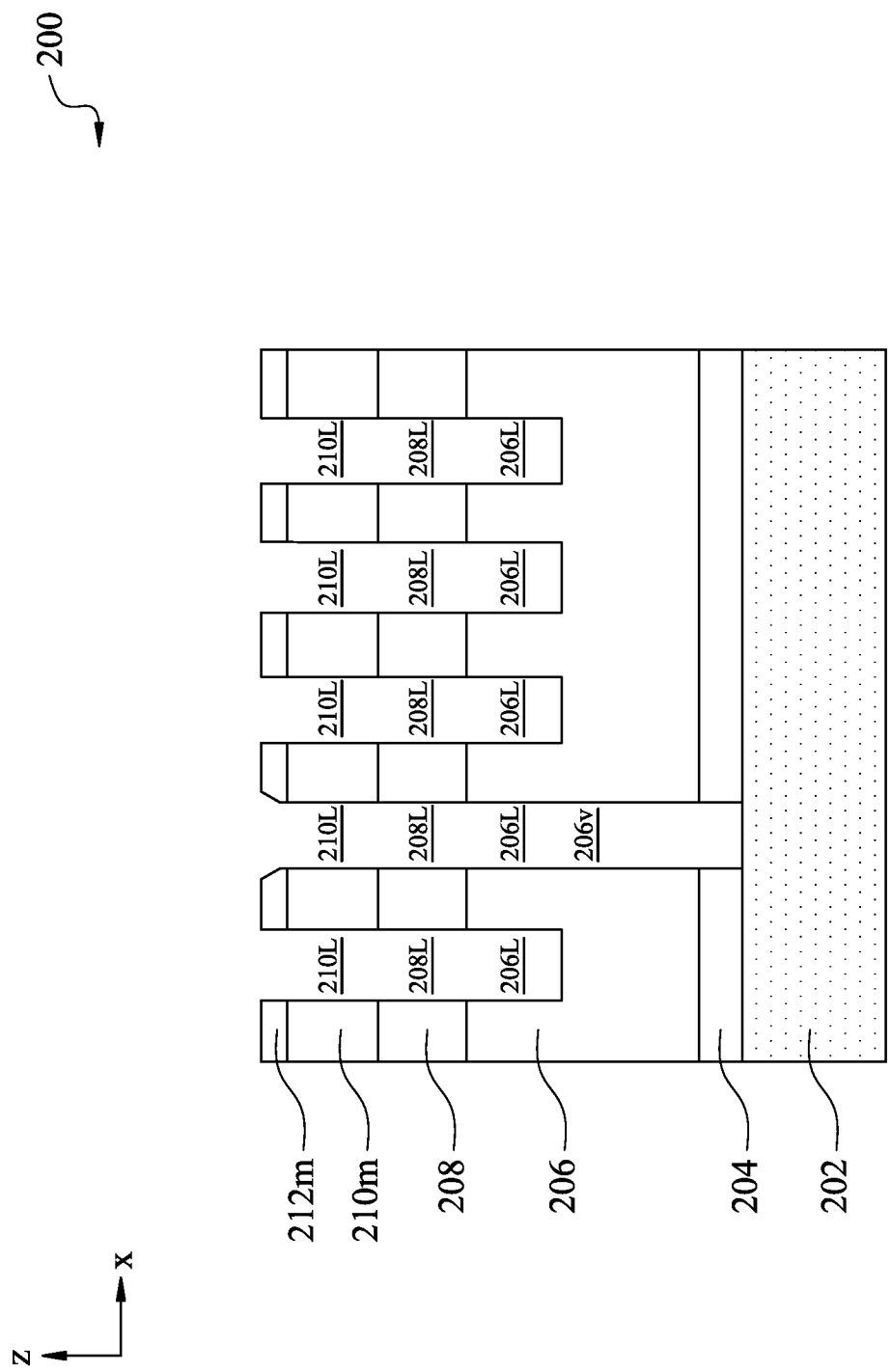
Figure 12B:
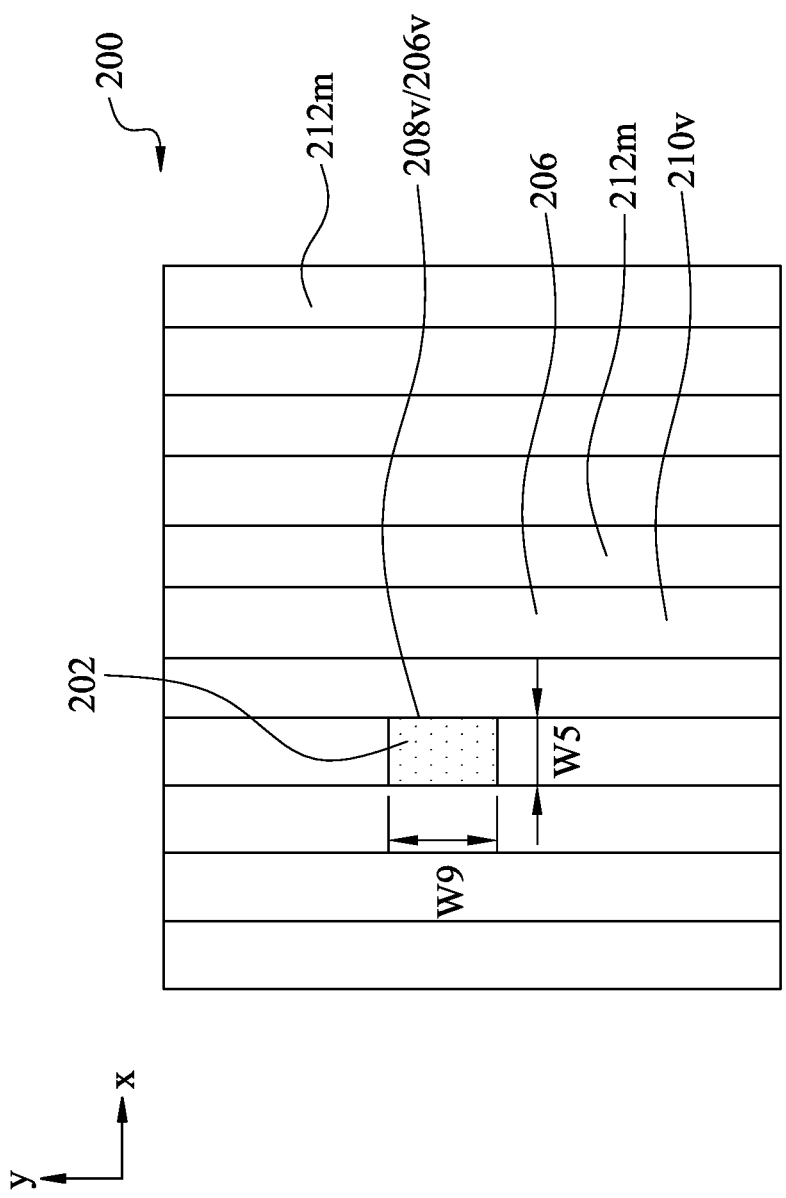

In operation 122 of the method 100, the pattern with openings 212L/210L in the third hard mask layer 212 and the second hard mask layer 210 is transferred to the first hard mask layer 208 and a portion of the dielectric layer 206, as shown in FIGS. 12A-12B. In operation 122, the first hard mask layer 208 and the dielectric layer 206 may be etched in the same process or with separate processes. In some embodiments, a plasma or RIE anisotropic etch may be used to form line openings 208L in the first hard mask layer 208 and line openings 206L in the dielectric layer 206 to achieve relatively uniform dimension. In some embodiment, a RIE process using an etchant having high etch rate over oxide may be used. Example etchants may include $CF_4$, or $CHF_3$, or other fluorine containing gas. In other embodiments, the first hard mask layer 208 and the dielectric layer 206 may be etched using any suitable etching process, for example, a wet etching process known as BOE (buffered oxide etch) using solution of hydrofluoric acid (HF) and ammonium fluoride ($NH_4F$). In other embodiments, the first hard mask layer 208 and the dielectric layer 206 may be removed using a dry etching process with an etchant including $CF_4$ and $H_2$.

The third hard mask layer 212 and second hard mask layer 210 serve as etching masks during formation of the line openings 208L, 206L. The third hard mask layer 212 may be consumed or substantially consumed during operation 122. In some embodiments, the etch stop layer 204 exposed by the via opening 206v is also removed extending the via opening 206v to the underlying layer.

As shown in FIG. 12B, because the mask strips 210m on both sides of the via opening 208v/206v maintain structural integrity during via patterning in operation 120, the line opening 210L/208L/206L at locations in connection with the via opening 206v is substantially uniform with other locations.

Figure 13:
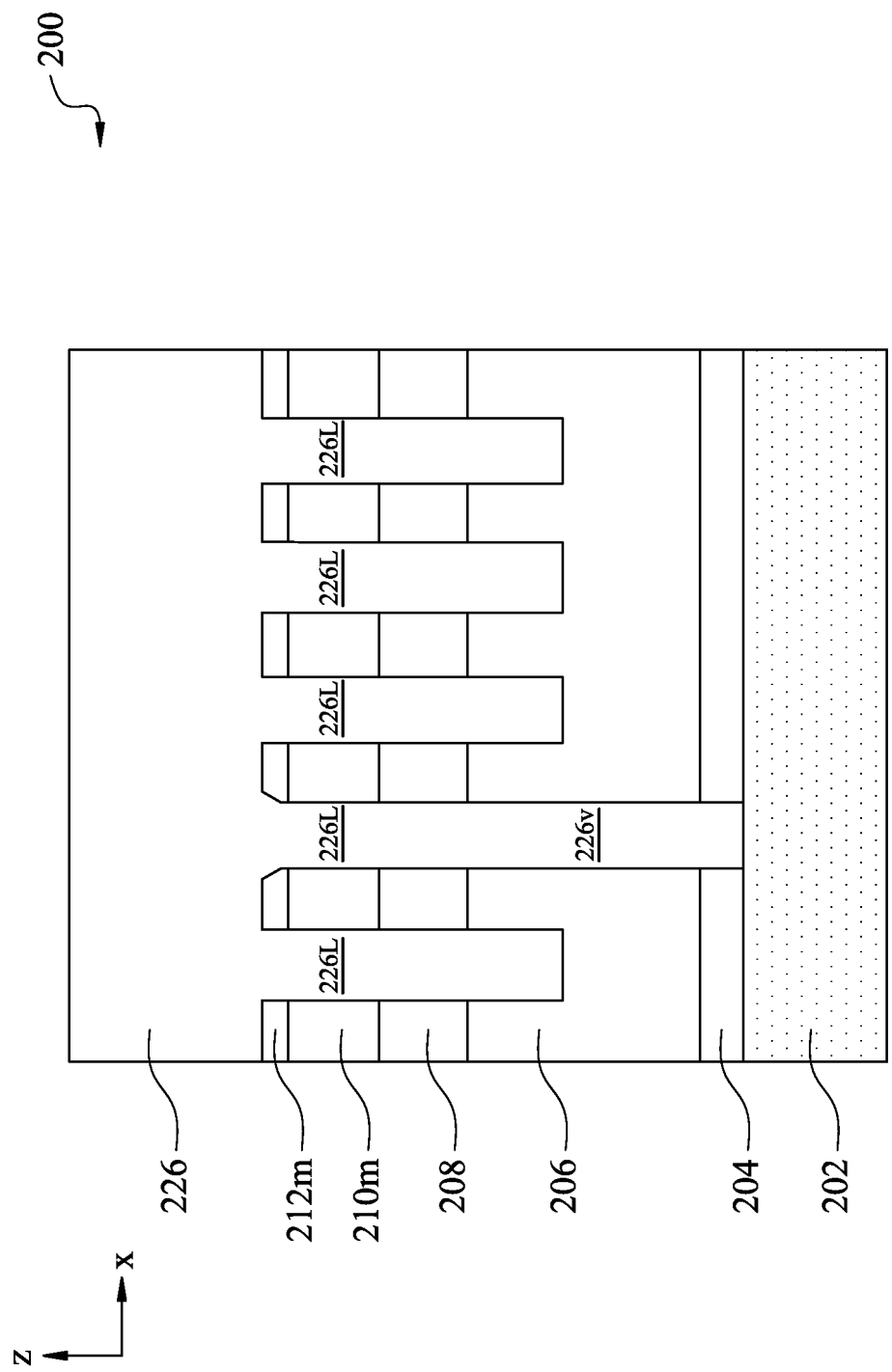

In operation 124 of the method 100, one or more conductive material are filled in the line openings 210L/208L/206L and via openings 208v/206v to form conductive lines 226L and conductive vias 226v respectively (collectively conductive features 226), as shown in FIG. 13.

The conductive material may include Co, Cu, Ag, Al, TiN, TaN, Ta, Ti, Hf, Zr, Ni, W, Zn, Ca, Au, Mg, Mo, Cr, or the like. The conductive material may be formed by CVD, PVD, plating, ALD, or other suitable technique. In some embodiments, one or more liners and/or barriers, not shown, may be formed along sidewalls and a bottom surface of the openings line openings 210L/208L/206L and via openings 208v/206v prior to filling the conductive material. The liners may include TiO, TiN, TaO, TaN, or the like, and may provide diffusion barrier, adhesion, and/or seed layers for the conductive lines.

Figure 14:
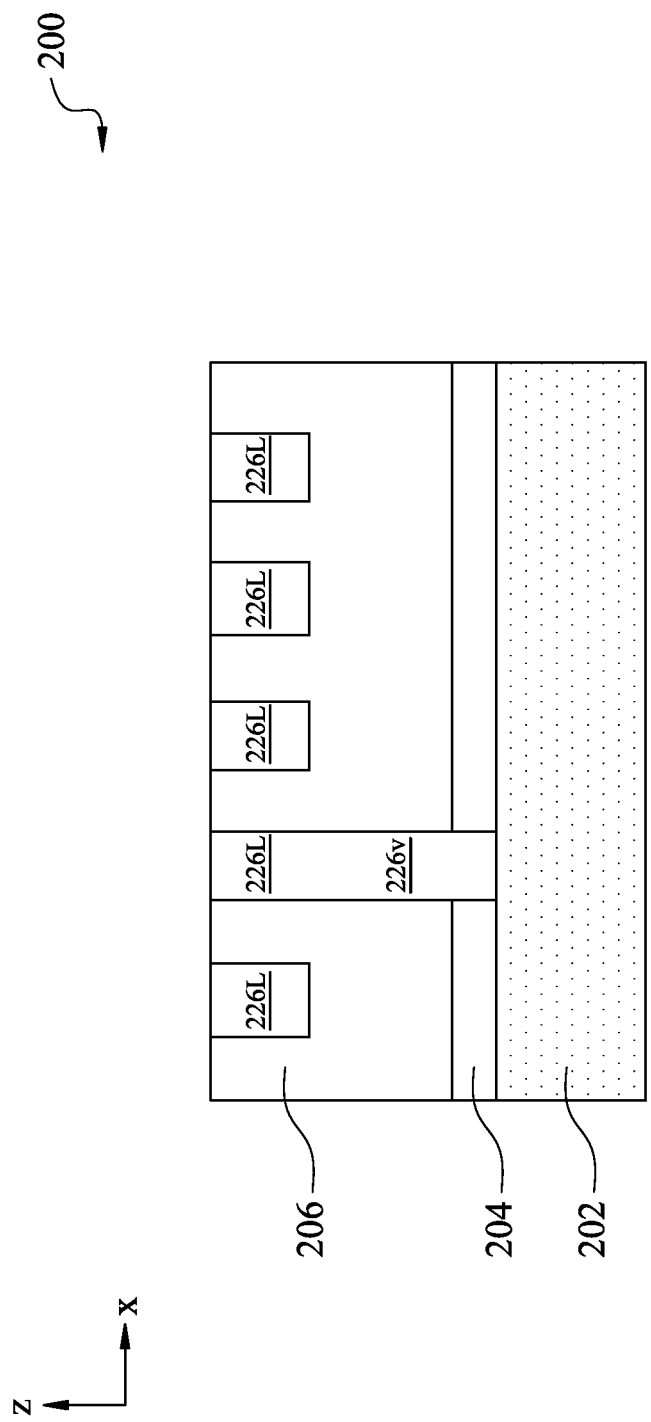

In operation 126, a planarization process, such as a chemical mechanical polishing (CMP) process is performed to remove excessive conductive material and expose the dielectric layer 206, as shown in FIG. 14. The conductive lines 226L and conductive vias 226v are formed within the dielectric layer 206.

Figure 15:
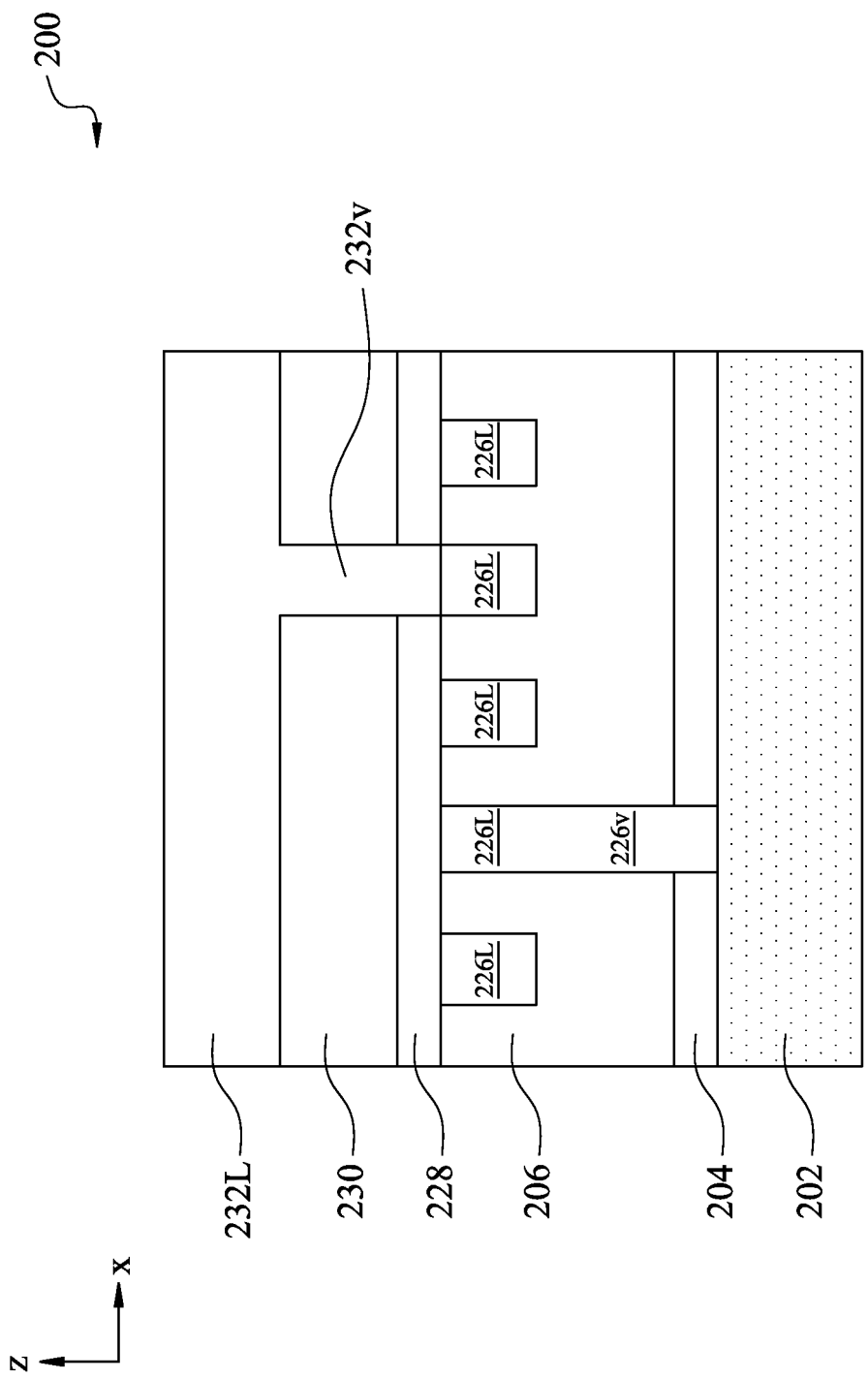

In operation 128, subsequent layers, such as another dielectric layer 230 with conductive vias 232v and conductive lines 232L may be formed thereon, as shown in FIG. 15. In some embodiments, the method 100 may be used to form the conductive vias 232v and the conductive lines 232L in the dielectric layer 230. Alternatively, interconnect structure or bond pad layer may be formed over the dielectric layer 206 according to the circuit design.

Various embodiments or examples described herein offer multiple advantages over the state-of-art technology. Embodiments of present disclosure provide a hard mask stack including a first dielectric mask layer, and second dielectric mask layer and a metal mask layer, wherein the first dielectric mask layer and second dielectric mask layer have a high etch selectivity. By selecting materials with high etch selectivity for the two dielectric layers, embodiments of the present disclosure enable pitch reduction without incur damages to conductive lines.

It will be understood that not all advantages have been necessarily discussed herein, no particular advantage is required for all embodiments or examples, and other embodiments or examples may offer different advantages.

Some embodiments of the present provide a method for fabricating a semiconductor structure. The method includes depositing a first hard mask layer over a dielectric layer, depositing a second hard mask layer on the first hard mask layer, wherein the second hard mask layer includes a metal-containing material, depositing a third hard mask layer over the second hard mask layer, wherein the third hard mask layer and the first hard mask layer have an etch selectivity relative to each other, forming a first pattern through the third hard mask layer and the second hard mask layer, forming a second pattern through the first hard mask layer and the dielectric layer while using the third hard mask layer as an etch stop, and transferring the first pattern from the third and second hard mask layers through the first hard mask layer to the dielectric layer.

Some embodiments of the present disclosure provide a method for fabricating a semiconductor structure. The method includes depositing a hard mask stack, wherein the hard mask stack comprises a first hard mask layer, a second hard mask layer disposed on the first hard mask layer, and a third hard mask layer disposed on the second hard mask layer, wherein the third hard mask layer comprises a nitride, and forming a plurality of mandrels on the hard mask stack, forming spacer mandrels on sidewall of the plurality of mandrels, wherein the spacer mandrels comprise an oxide, removing the plurality of mandrels, and etching the third hard mask layer using the spacer mandrels as an etching mask.

Some embodiments of the present disclosure provide a method for fabricating a semiconductor structure. The method includes depositing a first hard mask layer on a target layer, depositing a second hard mask layer on the first hard mask layer, wherein the second hard mask layer comprises a metal-containing material, depositing a third hard mask layer on the second hard mask layer, wherein the third hard mask layer is an oxygen-free layer, forming a first pattern through on the third hard mask layer and second hard mask layer, and forming a second pattern through the first hard mask layer, wherein the second pattern overlaps with the first pattern, and the third hard mask layer serves as an etch stop during patterning the first hard mask layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for fabricating a semiconductor structure, comprising,
    depositing a first hard mask layer over a dielectric layer;
    depositing a second hard mask layer on the first hard mask layer, wherein the second hard mask layer includes a metal-containing material;
    depositing a third hard mask layer over the second hard mask layer, wherein the third hard mask layer and the first hard mask layer have an etch selectivity relative to each other, wherein the first hard mask layer comprises an oxide, and the third hard mask layer comprises silicon nitride;
    forming a first pattern through the third hard mask layer and the second hard mask layer;
    forming a second pattern through the first hard mask layer and the dielectric layer while using the third hard mask layer as an etch stop; and then
    transferring the first pattern from the third and second hard mask layers through the first hard mask layer to an upper portion of the dielectric layer.

2. The method of claim 1, wherein the first hard mask is a nitrogen free layer.

3. The method of claim 1, wherein forming the first pattern through the third hard mask layer and the second hard mask layer comprises:
    forming a mandrel layer on the third hard mask layer;
    patterning the mandrel layer to form a plurality of mandrels;
    forming spacer mandrels on sidewalls of the plurality of mandrels;
    removing the plurality of mandrels; and
    etching the third hard mask and second hard mask using the spacer mandrels as an etching mask and the first hard mask layer as an etch stop.

4. The method of claim 3, wherein the spacer mandrels are formed form an oxide material.

5. The method of claim 3, wherein the mandrel layer comprises tin oxide.

6. A method for fabricating a semiconductor structure, comprising:
    depositing a hard mask stack, wherein the hard mask stack comprises:
        a first hard mask layer;
        a second hard mask layer disposed on the first hard mask layer; and
        a third hard mask layer disposed on the second hard mask layer, wherein the third hard mask layer comprises a nitride; and
    forming a plurality of mandrels on the hard mask stack;
    forming spacer mandrels on sidewall of the plurality of mandrels, wherein the spacer mandrels comprise an oxide;
    removing the plurality of mandrels;
    etching the third hard mask layer using the spacer mandrels as an etching mask;
    forming a via pattern over the first hard mask layer and a dielectric layer under the first hard mask layer; and then
    etching through the first hard mask layer and an upper portion of the dielectric layer using the third hard mask layer as an etching mask to form a line pattern in the upper portion of the dielectric layer.

7. The method of claim 6, wherein the first hard mask layer comprises an oxide, and the second hard mask layer comprises a metal.

8. The method of claim 6, wherein forming the plurality of mandrels comprises:
depositing a mandrel layer including amorphous silicon, carbon, or tin oxide; and
patterning the mandrel layer to form the plurality of mandrels on the third hard mask layer.

9. The method of claim 8, wherein the spacer mandrels comprise silicon oxide or titanium oxide.

10. The method of claim 6, wherein forming the via pattern comprises:
depositing a photoresist over the third hard mask layer;
patterning the photoresist to form a via opening through the photoresist, wherein the via opening is aligned with a line opening between two neighboring mandrels in the third hard mask layer, and at least one of the two neighboring mandrels is exposed by the via opening; and
etching through the first hard mask layer using the photoresist as an etching mask.

11. The method of claim 6, further comprising filling openings in the line pattern and the via pattern with a conductive material.

12. A method for fabricating a semiconductor structure, comprising:
depositing a first hard mask layer on a target layer;
depositing a second hard mask layer on the first hard mask layer, wherein the second hard mask layer comprises a metal-containing material;
depositing a third hard mask layer on the second hard mask layer, wherein the third hard mask layer is an oxygen-free layer;
forming a first pattern through the third hard mask layer and second hard mask layer;
forming a second pattern through the first hard mask layer, wherein the second pattern overlaps with the first pattern, and the third hard mask layer serves as an etch stop during patterning the first hard mask layer;
etching through the target layer using the second pattern in the first hard mask layer; and then
etching through the first hard mask layer and an upper portion of the target layer using the third hard mask layer as an etching mask to form the first pattern in the upper portion of the target layer.

13. The method of claim 12, wherein the third hard mask layer comprises silicon nitride.

14. The method of claim 13, wherein the first hard mask layer is a nitrogen-free layer.

15. The method of claim 14, wherein forming the first pattern comprises:
forming a plurality of first mandrels on the third hard mask layer; and
etching the third hard mask layer using the plurality of first mandrels as an etching mask.

16. The method of claim 15, wherein forming the plurality of first mandrels comprises:
depositing a mandrel layer on the third hard mask layer;
patterning the mandrel layer to form a plurality of second mandrels; and
depositing a spacer layer on side walls of the plurality of second mandrels to form the plurality of first mandrels.

17. The method of claim 16, wherein the plurality of first mandrels are formed from an oxide material.

18. The method of claim 12, wherein during etching through the first hard mask layer and the upper portion of the target layer, an etch stop layer under the target layer exposed by the second pattern is removed.

19. The method of claim 1, wherein during transferring the first pattern from the third and second hard mask layers through the first hard mask layer to the upper portion of the dielectric layer, an etch stop layer under the dielectric layer exposed by the second pattern is removed.

20. The method of claim 6, wherein during etching through the first hard mask layer and the upper portion of the dielectric layer, an etch stop layer under the dielectric layer exposed by the via pattern is removed.

* * * * *